(12) United States Patent
Matsuda et al.

(10) Patent No.: US 6,687,164 B2
(45) Date of Patent: Feb. 3, 2004

(54) NONVOLATILE MEMORY, IC CARD AND DATA PROCESSING SYSTEM

(75) Inventors: Yuki Matsuda, Pasadena, CA (US); Kenya Otani, Tokyo (JP); Minoru Kato, Akiruno (JP); Takeo Kon, Kodaira (JP)

(73) Assignees: Renesas Technology Corporation, Tokyo (JP); Hitachi ULSI Systems Co., Ltd., Tokyo (JP)

(*) Notice: Subject to any disclaimer, the term of this patent is extended or adjusted under 35 U.S.C. 154(b) by 0 days.

(21) Appl. No.: 10/424,855

(22) Filed: Apr. 29, 2003

(65) Prior Publication Data

US 2003/0202381 A1 Oct. 30, 2003

Related U.S. Application Data

(62) Division of application No. 10/347,803, filed on Jan. 22, 2003.

(30) Foreign Application Priority Data

Feb. 28, 2002 (JP) .................................. 2002-053105

(51) Int. Cl.$^7$ .............................................. G11C 16/04
(52) U.S. Cl. ........................... 365/185.29; 365/189.12; 365/233
(58) Field of Search ..................... 365/185.29, 189.12, 365/233

(56) References Cited

U.S. PATENT DOCUMENTS

| 5,867,428 | A | * | 2/1999 | Ishii et al. | ............. | 365/185.24 |
| 6,134,149 | A | * | 10/2000 | Lin | ............. | 365/185.29 |
| 6,459,617 | B1 | * | 10/2002 | Roohparvar | ............. | 365/185.11 |

* cited by examiner

Primary Examiner—Son T. Dinh
(74) Attorney, Agent, or Firm—Miles & Stockbridge, P.C.

(57) ABSTRACT

The invention facilitates to meet both of the mode of use that finds precedence in frequent rewrite to the nonvolatile memory and data retention during the power supply being cut off, and the mode of use that finds precedence in the data retention characteristic. The controller enables an information storage operation to the nonvolatile memory cells, by means of erase and write processing through boosting of the voltage applied to the nonvolatile memory cells and clamping of the boosted voltage, and performs a selection control that selects the application interval of the boosted voltage applied during the information storage operation and so forth. This selection control enables utilizing the nonvolatile memory cells as temporary rewrite areas, and facilitates to meet both of the mode of use that finds precedence in data retention during the power supply being cut off, and the mode of use that finds precedence in the data retention characteristic.

7 Claims, 17 Drawing Sheets

NONVOLATILE MEMORY, IC CARD AND DATA PROCESSING SYSTEM

CROSS-REFERENCE TO RELATED APPLICATION

This application is a division of application Ser. No. 10/347,803 filed Jan. 22, 2003, now pending.

BACKGROUND OF THE INVENTION

The present invention relates to a nonvolatile memory and a data processing device incorporating the same, specifically to a control method of the erase and write processing by applying a boosted voltage to nonvolatile memory cells, which is an effective technique for use in an IC (Integrated Circuit) card incorporating, for example, an EEPROM (Electrically Erasable and Programmable Read Only Memory) and a CPU (Central Processing Unit) and so forth.

The EEPROM is widely used together with a logical unit such as a CPU, in a microcomputer for an IC card. The nonvolatile memory cell of the EEPROM is composed of a two-transistor unit including a memory MOS transistor that takes charge of storage and a selection MOS transistor that selects the concerned memory MOS transistor and takes out the information. The memory MOS transistor often adopts the MONOS structure. The memory MOS transistor is made up with a source, drain, insulated silicon nitride film, and control gate. To attain a state in which the threshold voltage of the memory cell is programmed to a comparably high voltage, namely, the write state, it is needed to capture electrons in the silicon nitride film by applying a supply voltage (Vcc), for example, 3V to the control gate, and a high voltage (−Vpp), for example, −10V to a well region (back gate). To attain a state in which the threshold voltage of the memory cell is programmed to a comparably low voltage, namely, the erase sate, it is needed to store holes in the silicon nitride film by applying high voltage (−Vpp), for example, −10V to the control gate, and the supply voltage (Vcc), for example, 3V to the well region. In a microcomputer for an IC card and the like, a booster to generate the above high voltage is built in on one chip, so that operational power supplies are unified into a single supply voltage.

In order to evaluate the performance of an electrically erasable and rewritable nonvolatile memory, the rewritable frequency and the data retention characteristic are used as the indicator of performance. The characteristic deterioration of the silicon nitride film and so forth due to repeated applications of the high voltage gives a limitation to the rewritable frequency. As the applications thereat of the high voltage become more precipitous, the electric stresses become severer, which further advances the characteristic deterioration, so that the rewritable frequency becomes still lower. On the other hand, as the application time of the high voltage in the erase and write processing becomes longer, the amount of electrons and holes to be captured becomes increased; accordingly, the data retention characteristic (characteristic of time during which data are held stably without mutations) becomes improved.

Therefore, in order to achieve a satisfactory rewritable frequency and better data retention characteristic, it is necessary to comparably slow the boosting speed of applying the high voltage and to comparably elongate the application time of the high voltage.

SUMMARY OF THE INVENTION

The inventor examined the measures to counter the application program described in the programming language such as the JAVA (registered trademark) or the like (hereunder, simply referred to as virtual machine program), where it was found that the shortening of the rewrite time to the EEPROM was very important. It is necessary to frequently rewrite multiple variables in the execution of the virtual machine program; here, the inventor considered that it would become necessary to appropriate the EEPROM to the temporary areas for manipulating the variables, in such an environment that cannot afford to plentifully use RAMs (Random Access Memory) as the work areas. The inventor further discovered that the use of the nonvolatile memory represented by the EEPROM as the temporary areas retains temporary information as it is even when the power supply is unexpectedly cut off to enable restarting the processing without requesting the host machine to resend necessary information.

The applicant of this invention has already applied for PCT/JP00/05860, which is not yet disclosed internationally. This application discloses the technique that controls the boosting speed of a booster in rewriting an EEPROM. Focusing on the erase processing, it is only needed to apply the high voltage (−Vpp) such as −10 Volts to the control gate of the memory cell to be erased, however the high voltage (−Vpp) for the memory cell to be erased is to be applied to the well region of the memory cells not to be erased that share the control gate line. Since the capacitances of the control gate and the well region are considerably different, provided that the number of bits to be written in parallel is different, the number of memory cells to be erased in parallel, which is executed beforehand, is also different; and accordingly, the driven load of the booster that supplies the high voltage is to vary. Such a change of the driven load leads to a change of the boosting speed, and produces a difference of voltage stresses to be given to the memory cells; in consequence, significant electric stresses are accumulated in a part of the memory cells, and the rewritable frequency is anticipated to become abnormally insignificant. Accordingly, the above application by the applicant is to vary the frequency of the synchronous clock signal for the boosting operation in the booster according to the magnitude of the driven load, in a manner that the speed in the boosting operation becomes constant even if the number of memory cells to be erased in parallel varies.

An object of the present invention is to provide a technique relating to the nonvolatile memory to easily meet the mode of use that finds precedence in fast rewrite to the nonvolatile memory, and the mode of use that finds precedence in the data retention characteristic.

Another object of the invention is to provide a technique relating to the nonvolatile memory to easily meet the mode of use that finds precedence in frequent rewrite to the nonvolatile memory and data retention during the power supply being cut off, and the mode of use that finds precedence in the data retention characteristic.

The foregoing and other objects and the novel features of the invention will become apparent from the descriptions of this specification and the appended drawings thereof.

The typical disclosures of the invention will be summarized in brief as follows.

[1] According to one aspect of the invention, the nonvolatile memory is made capable of an information storage operation to nonvolatile memory cells by the erase and write processing through a boosted voltage applied to the nonvolatile memory cells and clamping of the boosted voltage, and includes a control means for the information storage operation. The control means is able to select a first information storage operation that requires a first time, and a second information storage operation that requires a second time shorter than the first time.

In the mode of use that finds precedence in fast rewrite to the nonvolatile memory, or the mode of use that finds precedence in frequent rewrite to the nonvolatile memory and data retention during the power supply being cut off, the control means selects the second information storage operation. In the mode of use that finds precedence in the data retention characteristic, the control means selects the first information storage operation.

Many cases find that the influence to the data retention characteristic by the erase and write processing is different. When the influence to the data retention characteristic is less in the erase processing time, it is more favorable in terms of reliability to gain the difference of the first time and second time by the time difference of the erase processing. When the influence to the data retention characteristic is less in the write processing time, it is needed to gain the difference of the first time and second time by the time difference of the write processing.

The foregoing nonvolatile memory facilitates to meet both of the mode of use that puts fast rewrite to precedence, and the mode of use that puts the data retention characteristic to precedence.

As a concrete mode of this invention, the erase processing time and write processing time each can be defined as the sum of the boosting operation time to gain the boosted voltage and the clamping operation time to maintain the boosted voltage. Or, the times may be defined as the claming operation time. In the latter case, it is only needed to first detect the timing to reach the clamping voltage level, and to control the times of the erase processing and write processing, by using the timing as the starting point.

In another concrete mode of this invention, a register is provided which designates to select either the first information storage operation or the second information storage operation. Only a change of the set value of this register will easily change the selection of the first information storage operation or the second information storage operation. It becomes possible to arbitrarily change the selection according to the processing contents by the operation program of the CPU utilizing the nonvolatile memory and so forth.

The difference of the boosting speed of the voltages applied to the nonvolatile memory cells in the erase and write processing leads to the difference of the electric stresses given to the memory cells when the high voltage is applied. Since the electric stresses affect the rewritable frequency of the nonvolatile memory cells, the difference thereof effects the dispersion of secular characteristic deterioration. In order to prevent this sort of dispersion from occurring, it is needed to control the boosting speed of the voltages applied to the nonvolatile memory cells in the erase and write processing to be constant according to the magnitude of the load of the booster. For example, in the first information storage operation and the second information storage operation, the control means controls to regularize the boosting speed of the boosted voltage applied in the erase processing and/or write processing, regardless of the number of the nonvolatile memory cells to be erased in parallel and/or to be written in parallel.

As another concrete mode of this invention, the nonvolatile memory is able to adopt the MONOS structure that the nonvolatile memory cells possess an insulating charge trapping region between the channel and the control gate, and store different information according to the amount of the electrons or holes trapped in the charge trapping region. The minimum unit of the foregoing information storage operation is specified as a plurality of nonvolatile memory cells that share the well region. In the erase processing, for example, the supply voltage is applied to the well region of the objective nonvolatile memory cells, the boosted voltage is applied to the control gate line, and with regard to the nonvolatile memory cells of the non-selection of erase (inhibition of erase) that share the control gate line, the boosted voltage is applied to the well region thereof. The load of the booster differs depending on that the load is the control gate line or the well region, and the load driven by the booster varies according to the number of the objective memory cells of the erase processing.

As another concrete mode of this invention, the control means is able to select the clamping level of the boosted voltage. As the clamping level is heightened, the data retention characteristic is bettered according to the level. The withstand voltage of the circuit has to meet the maximum of the clamping level.

[2] According to another aspect of the invention, the IC card possesses a nonvolatile memory, which is made capable of an information storage operation to nonvolatile memory cells by the erase and write processing through a boosted voltage applied to the nonvolatile memory cells and clamping of the boosted voltage, and includes a control means for the information storage operation. The control means executes a selection control that selects an application interval of the boosted voltage applied during the information storage operation, and a boosting operation control that regularizes the boosting speed of the voltage applied from the start of boosting until the start of clamping.

By means of the selection control, the IC card satisfies both of the mode of use that finds precedence in fast rewrite to the nonvolatile memory, or finds precedence in frequent rewrite to the nonvolatile memory and data retention during the power supply being cut off, and the mode of use that finds precedence in the data retention characteristic. And, by means of the boosting operation control, the IC card is able to prevent the dispersion of the electric stresses given to the memory cells due to the difference of the boosting speed of the voltage applied to the nonvolatile memory cells in the erase and write operations, or to avoid the experience of excessive stresses; and it is possible to maintain a satisfactory characteristic related to the rewritable frequency of the nonvolatile memory cells.

In a concrete mode of the invention, the sum of a boosting interval of the voltage applied to the nonvolatile memory cells and a clamping interval of the boosted voltage is defined as the application interval of the boosted voltage, and the objective to which the boosting operation control regularizes the boosting speed is defined as the boosting interval. In another mode, a clamping operation interval of the boosted voltage is defined as the application interval of the boosted voltage, and the objective to which the boosting operation control regularizes the boosting speed is defined as the boosting operation interval.

In a concrete mode relating to the selection control, the IC card further includes a register, and the control means obtains information for designating the application interval to be selected by the selection control from the register. In another concrete mode of the invention, the IC card further includes a central processing unit and an external interface circuit, and the central processing unit sets the information for designating the application interval to be selected by the selection control in the register. In another concrete mode, the external interface circuit inputs the information that the central processing unit is to set in the register from the outside. In another concrete mode, the control means includes a clock generator that generates plural clock signals of different frequencies, a clock selector that selects the clock signals generated by the clock generator, and a timing controller that inputs the clock signals selected by the clock selector and generates timing signals for defining the application interval of the boosted voltage, in which the timing controller generates timing signals of different cycles in accordance with the frequencies of the clock signals inputted thereto, and the clock selector selects the clock signals on the basis of the values set in the register. For example, the timing controller is composed to possess a binary counter of plural bits that transmits the clock signals outputted from the clock selector to post-stages. If the clock signal frequency is made different, the frequencies of the frequency-divided signals obtained from each storage stage of the binary counter are made varied.

In the concrete mode relating to the boosting operation control, the control means generates boosting speed control data for determining the boosting speed to be controlled by the boosting operation control, on the basis of the number of the nonvolatile memory cells being objectives of the information storage operation in parallel. In another concrete mode, a booster to generate the boosted voltage includes a charge-pump circuit that executes the boosting operation synchronously with a clock signal, and the boosting speed control data controls the charge-pump circuit in accordance with the number of the nonvolatile memory cells being the objectives of the information storage operation in parallel, so as to make the frequency of the clock signal higher as a driven load is heavier. In another concrete mode, the control means is capable of selecting a clamping level of the boosted voltage.

[3] According to another aspect of the invention, the data processing device includes a central processing unit and a nonvolatile memory. The central processing unit executes an information storage control to the nonvolatile memory. The information storage control is to execute the erase and write processing of the data stored in the nonvolatile memory. In a first information storage control of the information storage control, an information storage control is executed which requires a first time for the erase of the data stored in the nonvolatile memory. In a second information storage control of the information storage control, an information storage control is executed which requires a second time shorter than the first time for the erase of the data stored in the nonvolatile memory. And, either of the first information storage control and the second information storage control is made selectable. In another concrete mode, in the first information storage control, the write of the data to be stored in the nonvolatile memory requires a third time, and in the second information storage control, the write of the data to be stored in the nonvolatile memory requires a fourth time shorter than the third time.

With regard to the selection of the first or the second information storage control, in a concrete mode, the selection is made by means of a program executed by the central processing unit. That is, the data processing device includes a memory area that stores a program executed by the central processing unit, and the program controls a step, in storing data in the nonvolatile memory, that selects either to store the data by the first information storage control, or to store the data by the second information storage control.

In another concrete mode, the data processing device includes a register that designates to select either of the first information storage control and the second information storage control. And, the step sets information for indicating the register to select either of the first information storage control and the second information storage control. In this case, the register may contain an area that allows setting at least one of the second time and the fourth time. The memory area is, for example, a part of the nonvolatile memory.

With regard to the selection of the first or the second information storage control, according to another aspect, the central processing unit is able to receive control information for selecting either to execute the first information storage control, or to execute the second information storage control, from the outside of the data processing device.

DETAILED DESCRIPTION OF THE PREFERRED EMBODIMENTS

Figure 1:
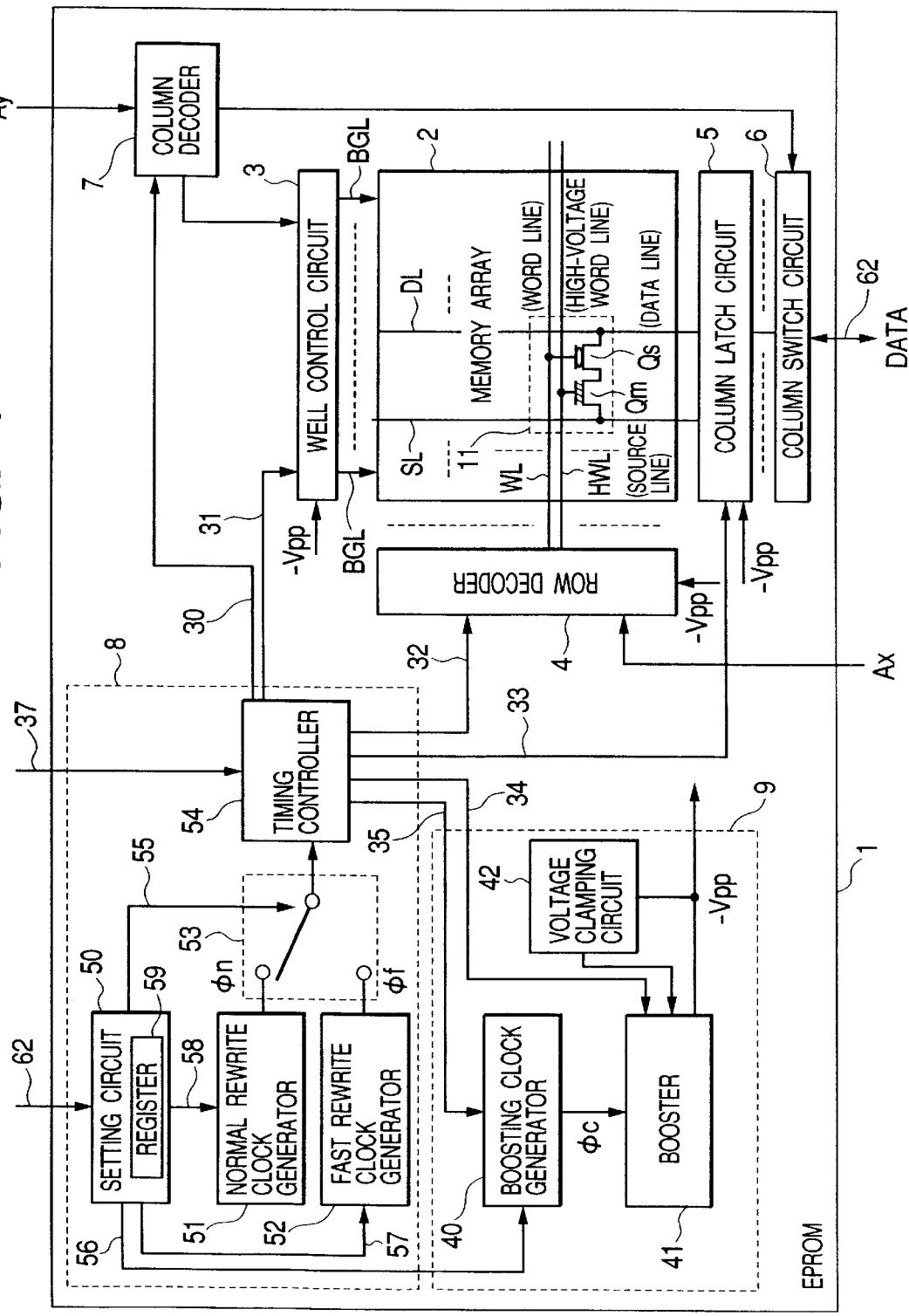
FIG. 1 is a block diagram of an EEPROM as an example of a nonvolatile memory relating to the present invention.

FIG. 1 illustrates an EEPROM as an example of the nonvolatile memory of this invention. The EEPROM 1 includes a memory array 2, well control circuit 3, row decoder 4, column latch circuit 5, column switch circuit 6, column decoder 7, controller 8, and high voltage supply 9, which is formed on a semiconductor substrate (semiconductor chip) such as a single crystal silicon by means of the CMOS integrated circuit manufacturing technique, or the like.

The memory array 2 includes a plurality of nonvolatile memory cells 11 that are representatively illustrated in FIG. 1. In practice, plural nonvolatile memory cells 11 are arrayed in matrix. For example, 512 pieces, namely, 64 bytes of memory cells are arrayed laterally, and the memory cells 11 are formed in separate well regions each by one byte.

The memory cell 11 is composed of a two-transistor unit including a memory MOS transistor Qm that takes charge of storage, and a selecting MOS transistor Qs that selects the concerned memory MOS transistor and takes out the information. The drain of the memory MOS transistor Qm is connected to a representatively illustrated source line SL, and the source of the memory MOS transistor Qs is connected to a representatively illustrated data line DL. The control gate of the memory MOS transistor Qm is connected to a representatively illustrated high voltage word line HWL, and the gate of the memory MOS transistor Qs is connected to a representatively illustrated word line WL. The well regions (back gates) of the transistors Qm, Qs are connected to well potential lines BGL in a unit of well.

Figure 2:
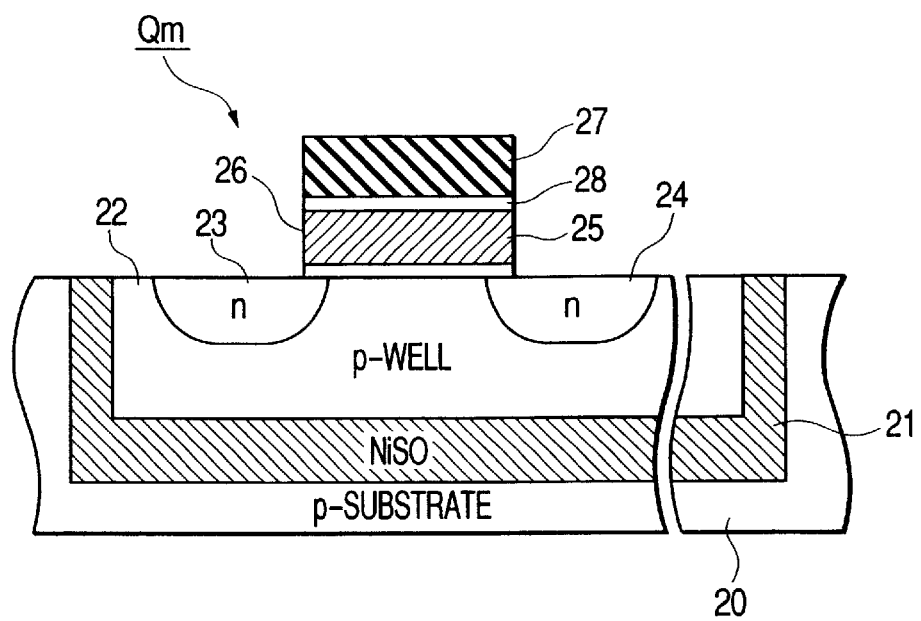
FIG. 2 is a vertical sectional view illustrating the device structure of a memory MOS transistor.

The memory MOS transistor Qm adopts the MONOS structure, for example. The memory MOS transistor Qm is formed of, as shown in FIG. 2, for example, an n-type source 23, n-type drain 24, gate oxide film 25, silicon nitride film 26 of which surrounding is insulated, top oxide film 28 and control gate 27, which overlies a p-type well region 22 surrounded by a n-type insulating region (NiSO) 21 on a p-type semiconductor substrate 20.

Figure 3:
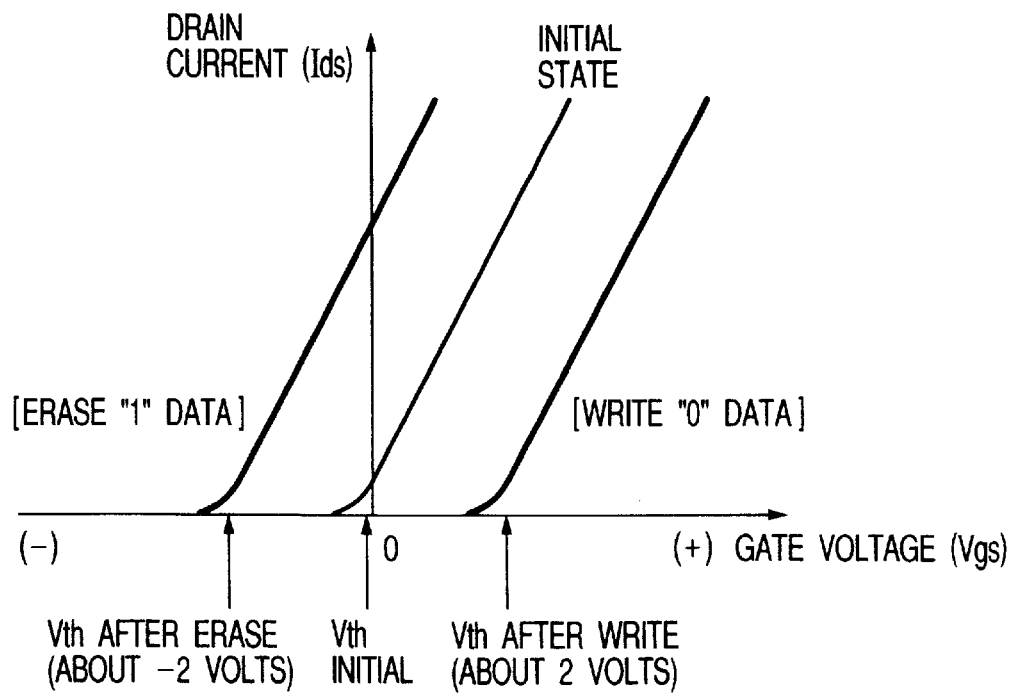
FIG. 3 is a characteristic chart illustrating the threshold voltage characteristics of an erased state and a written state with the thermal equilibrium state of the memory MOS transistor put in the center.

The initial threshold voltage in the thermal equilibrium state (initial state) of the memory MOS transistor Qm is defined as 0 Volt; as shown in FIG. 3, the state in which the threshold voltage (Vth) is lower than that (for example, about −2 Volts) is defined as the erase state, and the state in which it is higher than that (for example, about 2 Volts) is defined as the write state.

In order to attain the erase state, as shown in the erase processing of FIG. 4(A), it is needed to apply the high voltage (−Vpp) such as −10 V to the control gate 27 through the high voltage word line HWL, and the supply voltage (Vcc) such as 3 V to the well region 22 through the well potential line BGL to thereby store holes in the nitride film 26. Here, it is assumed that the word line WL, source line SL, and data line DL are supplied with the supply voltage (Vcc). The minimum unit in the erase processing is specified as a well region unit. In order to set a memory cell of the nonvolatile memory cells that share the high voltage word line HWL into the non-selection state of erase, as shown in FIG. 4(B), it is needed to apply the high voltage (−Vpp) to the well region 22 of the memory cell through the well potential line BGL.

In order to attain the write state, as shown in the write processing of FIG. 4(C), it is needed to apply the supply voltage (Vcc) such as 3 V to the control gate 27 through the high voltage word line HWL, the high voltage (−Vpp) such as −10 V to the well region 22 through the well potential line BGL, and the high voltage (−Vpp) to the source line SL and the data line DL to thereby capture electrons in the nitride film 26. Here, the word line WL is assumed to be at the supply voltage (Vcc). The write processing corresponds to the data storage of the logical value "0", and the memory cell that stores the data of logical value "1" is only needed to maintain the erase state. Therefore, in order to set a memory cell into the non-selection state of write, as shown in FIG. 4(D), it is needed to bring the source line SL into floating and apply the supply voltage (Vcc) to the data line DL.

In the read operation to the nonvolatile memory cell to which the information storage (rewrite) is executed through the erase and write processing, as shown in FIG. 4(E), all the well regions 22 are connected to the supply voltage Vcc through the well potential line BGL, and all the high voltage word lines HWL are connected to the ground voltage (0V) of the circuit. After the data line DL is pre-charged, the word line WL is set to the supply voltage Vcc to thereby select the memory cell 11 through the selecting MOS transistor Qs. If the memory MOS transistor Qm of the selected memory cell is in the erase state, a current flows from the data line DL into the source line SL, whereby the logical value "1" of the stored information is judged by the voltage or current variation that this current creates on the data line DL. If the memory MOS transistor Qm of the selected memory cell is in the write state, any current does not flow from the data line DL into the source line SL, whereby the logical value "0" of the stored information is judged by the voltage or current variation being not created on the data line DL.

The controller 8 in FIG. 1, receiving an access control signal (or access control data) 37 from the outside, supplies the related units with control signals 30 through 35 that control the information storage operation by the erase and write processing and the read operation of the stored information. The row decoder 4 decodes a row address signal Ax to form selection signals for the word line WL and the high voltage word line HWL, whereat the control signal 32 controls the word line selection timing and the high voltage word line selection timing. The column decoder 7 decodes a column address signal Ay to form a selection signal for the column switch circuit 6 and a well selection signal for the well control circuit 3. The control signal 30 controls the selection timing thereat. The well control circuit 3 drives to control the well potential lines BGL, the control signal 31 controls the drive mode thereof, and the selection of the well potential lines BGL when driving to control the well potential lines BGL is executed on the basis of the output of the column decoder 7. The column latch circuit 5 possesses data latches allocated to data lines each, and in the information storage operation, a write data inputted from the outside is retained in a data latch selected by the column switch circuit 6. In the read operation, the column switch circuit 6 selects a read data latched by the column latch circuit 5 in correspondence with one word line WL, and outputs it to the outside. The control signal 33 controls the timing and drive mode that drive the source line and data line on the basis of the write data latched by the column latch circuit 5.

The high voltage supply 9 includes a boosting clock generator 40, booster 41 that executes a charge pumping synchronously with the clock, and voltage clamping circuit 42, which boosts up the supply voltage Vcc into a high voltage such as −Vpp. The high voltage supply 9 supplies the high voltage −Vpp by means of the boosting operation and the boosted voltage clamping operation, at each erase interval and each write interval. The boosting operation timing and so forth are controlled by the control signals 34 and 35.

Figure 4:
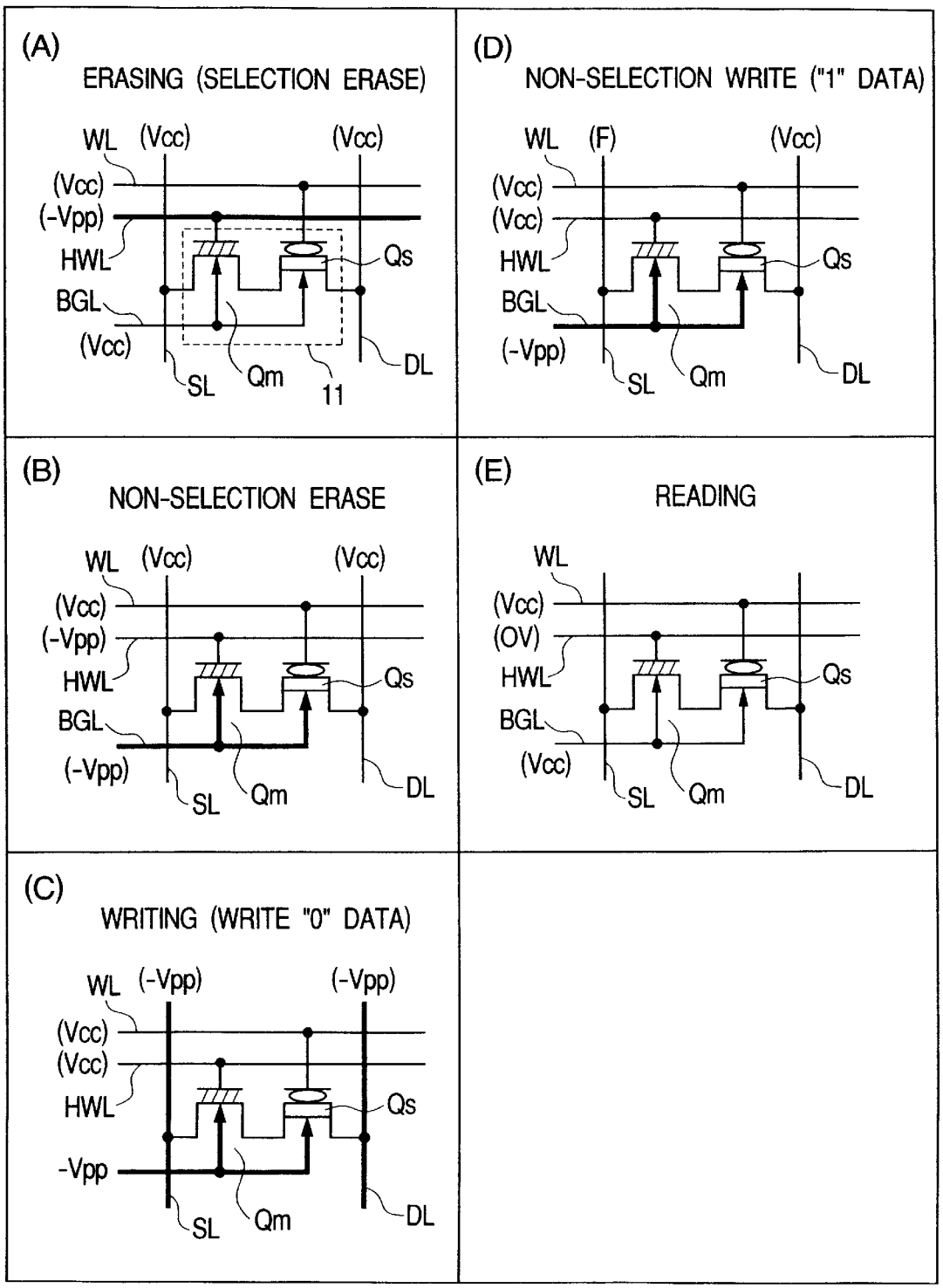
FIG. 4 is an explanatory chart illustrating the states of voltages being applied to the memory cells in each processing of the erase, non-selection of erase, write, non-selection of write, and read.

The basic control of the erase and write processing by the controller 8 is to achieve the operation described in FIG. 4. In addition, the controller 8 executes the selection control that selects an application interval of the boosted voltage applied during the information storage operation, and the boosting operation control that regularizes the boosting speed of the voltage applied from the start of boosting until the start of clamping. The control functions will now be described in detail.

Figure 5:
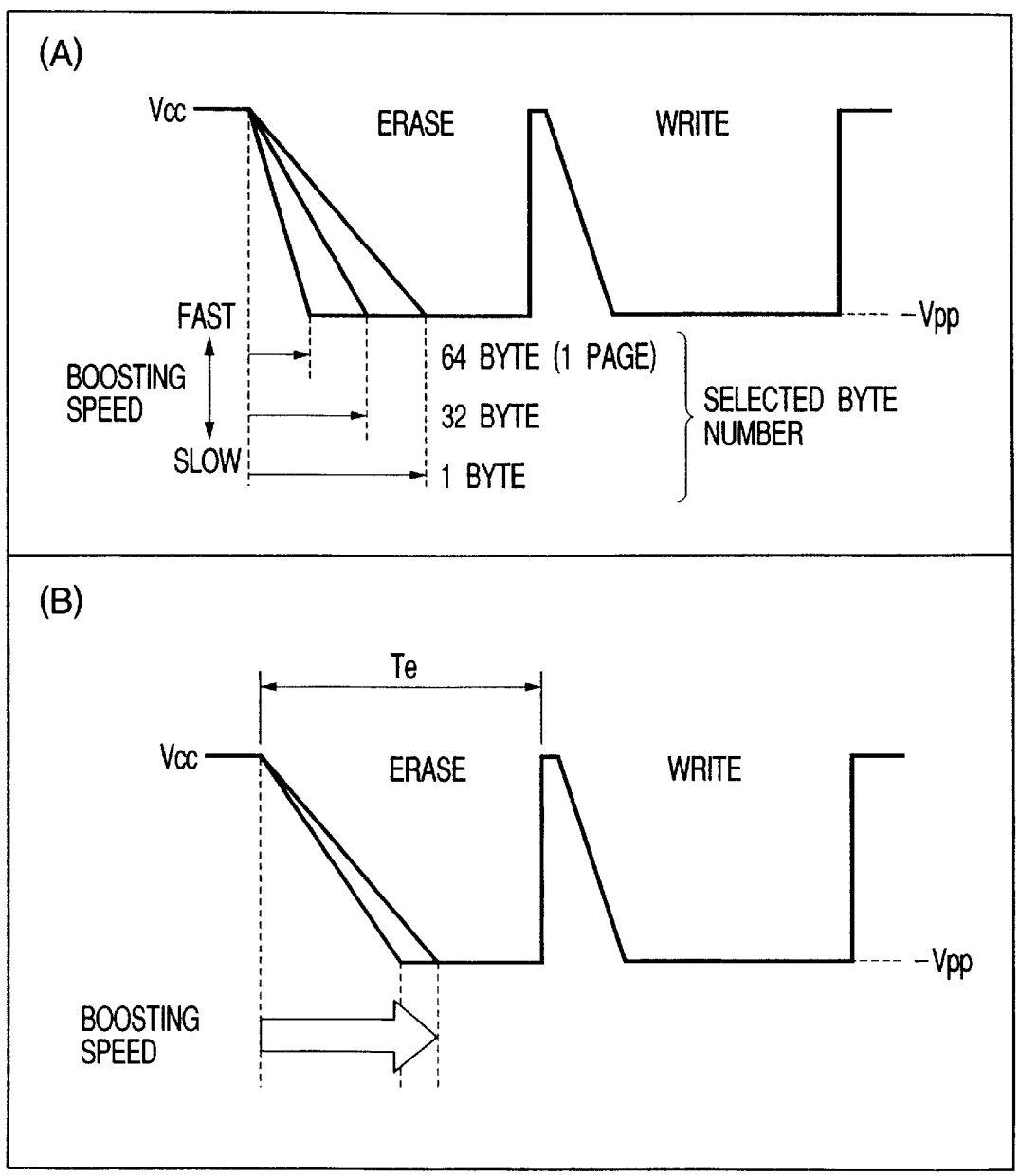
FIG. 5 is an explanatory chart comparably illustrating the boosting speed variation by the driven load of a booster due to the difference of capacitance components in the control gate and the well region, and the boosting speed for controlling it into constant.
Figure 6:
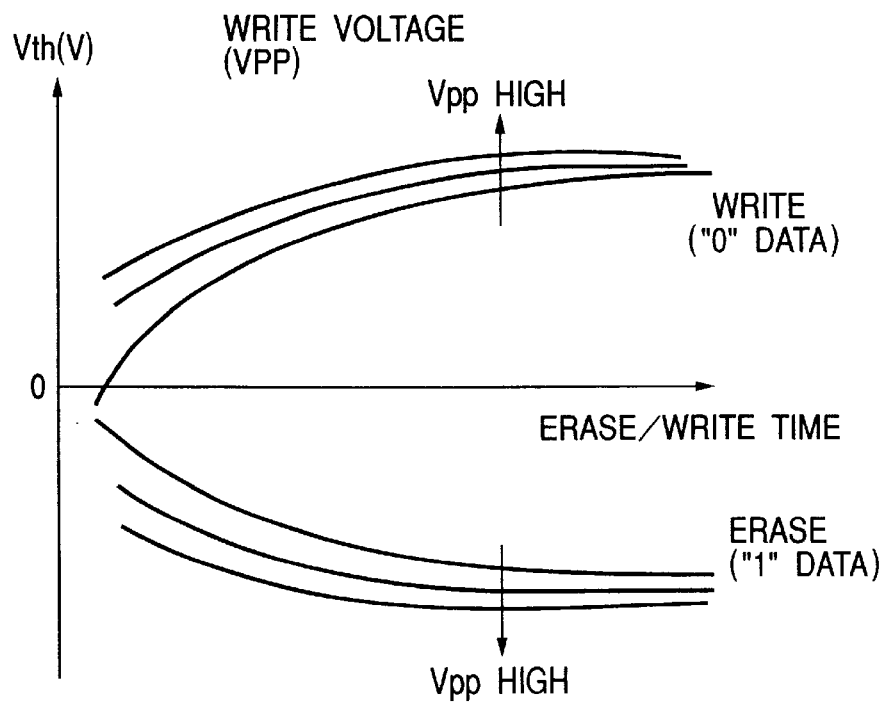
FIG. 6 is an explanatory chart illustrating the characteristic of the threshold voltage variation against the time of the high voltage being applied in the erase and write.

In the beginning, the boosting operation control will be described. Focusing on the erase processing, as described in FIG. 4, it is only needed to apply the high voltage (−Vpp) such as −10 Volts to the control gate of the memory cell 11 to be erased through the high voltage word line HWL, however the high voltage (−Vpp) for the erase processing is to be applied to the well regions of the memory cells not to be erased that share the high voltage word line HWL through the well potential lines BGL. Since the capacitances of the control gate 27 and the well region 22 are considerably different, provided that the number of bytes to be written in parallel is different, the number of memory cells to be erased in parallel, which is executed beforehand, is also different; and accordingly, the driven load of the booster 41 that supplies the high voltage is to vary. As illustrated in FIG. 5, for example, as the byte number of parallel data in the information storage operation is smaller, the well region to which the high voltage is applied becomes larger; accordingly, the driven load becomes greater, which requires more time for the boosting operation to attain the high voltage (−Vpp). Such a change of the driven load leads to a change of the boosting speed, and produces a difference of voltage stresses to be given to the memory cells; in consequence, significant electric stresses are accumulated in a part of the memory cells, and the rewritable frequency is anticipated to become abnormally insignificant. Further, in case that the erase time is controlled into constant as Te in the erase processing, if the boosting speed is dispersed, the application interval of the high voltage (−Vpp) after being boosted is also dispersed, which leads to apprehensions of the data retention characteristic being dispersed. The reason lies in that, as illustrated in FIG. 6, as the time of applying the high voltage in the erase and write processing is longer, and as the level of the high voltage is higher, the absolute value of the threshold voltage Vth of the nonvolatile memory cell becomes greater. Accordingly, the high voltage supply 9 is needed to execute the boosting operation control that varies the frequency of the synchronous clock signal φc for the boosting operation in the booster 41 in accordance with the magnitude of the driven load.

Figure 7:
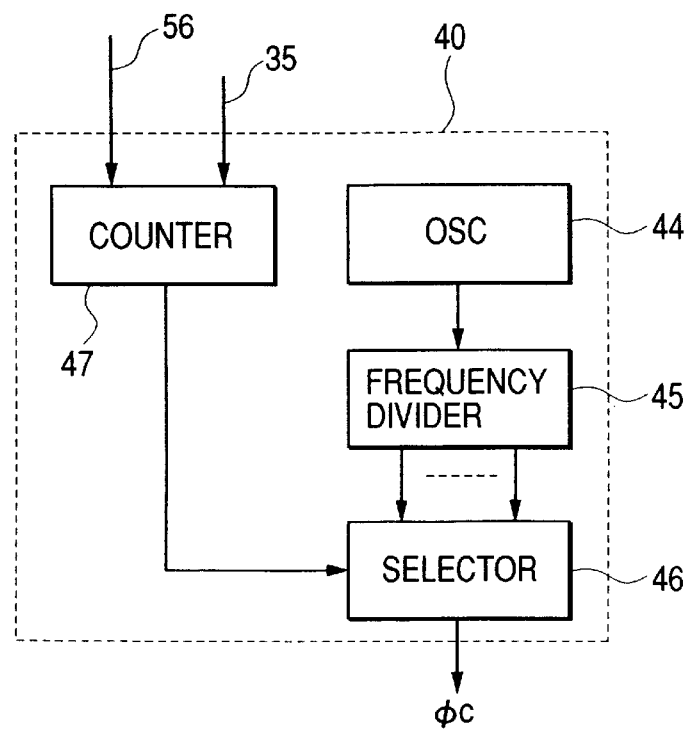
FIG. 7 is a block diagram illustrating the detail of a boosting clock generator being in charge of the major part of the boosting control operation.

FIG. 7 illustrates the detail of the boosting clock generator 40 being in charge of the major part of the boosting control operation. The boosting clock generator 40 includes an oscillator 44, frequency divider 45, selector 46, and counter 47. The frequency divider 45 generates the clock signals in which the oscillated signal from the oscillator 44 is sequentially divided into ½ in frequency. The selector 46 selects one of the frequency-divided signals, and outputs it as the synchronous clock signal φc. The counter 47 generates a selection signal of the selector 46. The counter 47 counts the byte number of the data written by the information storage operation. That is, the counter 47 counts the byte number of transferred data to follow the variation of the control signal 35, when the written data is sequentially latched in a unit of byte by the column latch circuit 5. Here, the control signal 35 is the timing signal to synchronize with the latch operation of the column latch circuit 5. By counting the control signal 35, the counter 47 attains the byte number of the written data. Although not illustrated particularly, the counter 47 is configured with full adders connected in series, and produces the output of the plural adders at specific positions, or the signal obtained by the logical operation of these as the selection signal of the selector 46. For example, as the counted value is smaller, a frequency-divided signal of a higher frequency the counter 47 is to select as the synchronous clock signal φc. The initial value is made presetable to this counter 47, and the selection signal of the synchronous clock signal φc can be formed with the value as the starting point. In short, the boosting speed to be controlled into a constant becomes selectable among the low speed, standard speed, and high speed. For example, the first preset value given by the signal 56 is served as the standard value, and the boosting speed is controlled into the constant speed by the standard speed; in case the second preset value smaller than the first is set by the signal 56, the boosting speed is controlled into the constant speed by the high speed; and in case the third preset value larger than the second is set by the signal 56, the boosting speed is controlled into the constant speed by the low speed.

In the next place, the selection control by the controller 8 will be described. In the example of FIG. 1, a normal rewrite clock generator 51 and a fast rewrite clock generator 52 each include a ring oscillator as the essential part, and the gate stage number of the feedback loop thereof is made selectable, and the frequencies of the clock signals φn, φf to be outputted are made selectable. A selector 53 selects either the clock signal φn or φf and gives the result to a timing controller 54. Selection signals 58, 57 of the above frequencies, selection signal 55 to the selector 53, and the preset data 56 to the counter 47 are determined in accordance with the values of a register 59 contained in a setting circuit 50. For example, when the data designating the normal rewrite mode is set in the register 59, the selector 53 selects the clock signal φn, and thereby the EEPROM 1 is put into the normal operation mode. On the other hand, when the data designating the fast rewrite mode is set in the register 59, the selector 53 selects the clock signal φf, and thereby the EEPROM 1 is put into the fast operation mode.

The timing controller 54 inputs the clock signal φn or φf selected by the selector 53, frequency-divides the inputted clock signal, and generates the control signals 30 through 35 from plural frequency-divided clock signals by means of logic circuits.

Figure 8:
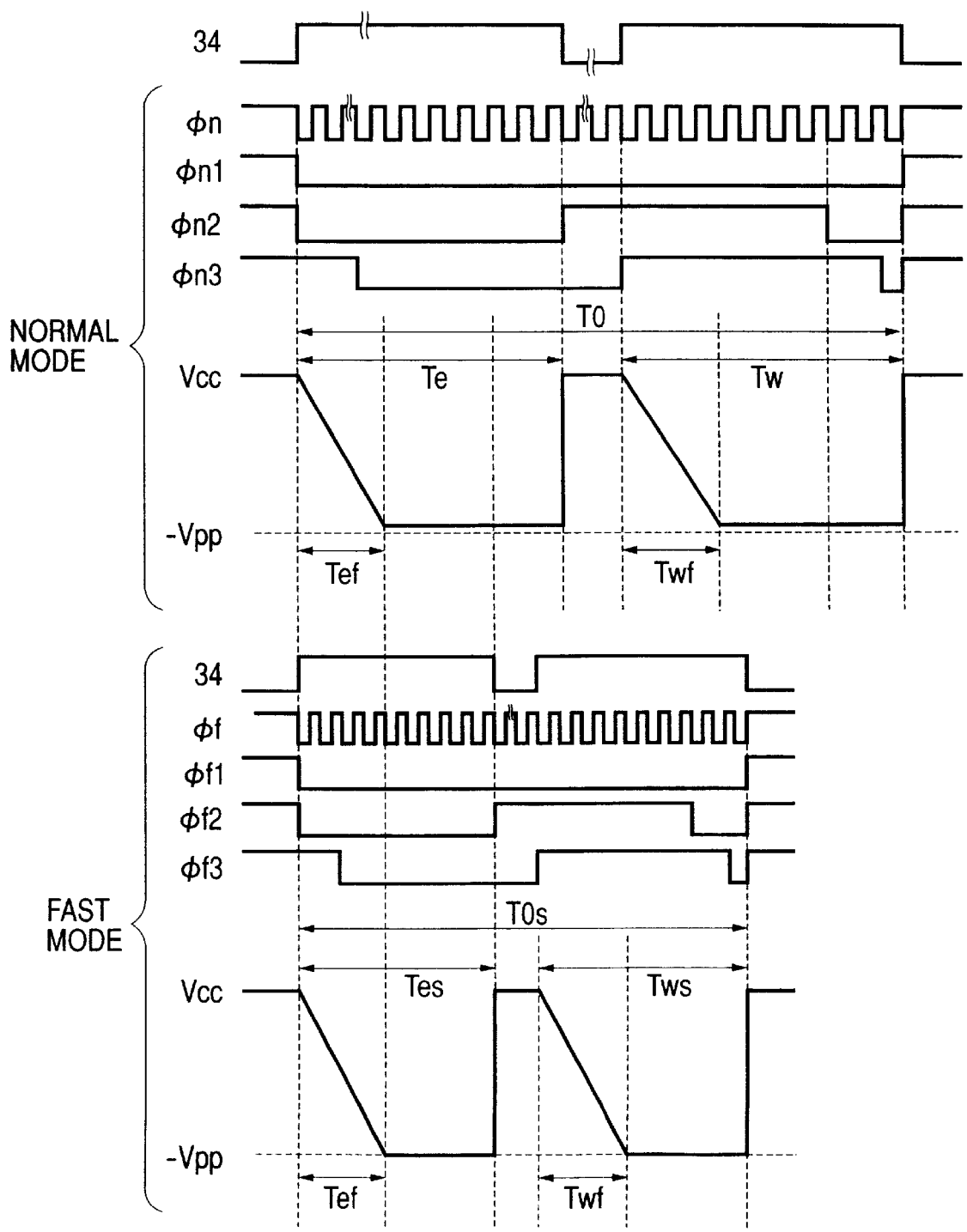
FIG. 8 is a waveform chart illustrating the timing of the rewrite operation (information storage operation) in the normal mode and the fast mode.

FIG. 8 illustrates the timing of the rewrite operation (information storage operation) in the normal mode and the fast mode. Timing signals φn1, φn2, φn3 in the normal mode are serves as internal clock signals of the timing controller 54, which are generated by frequency-dividing the clock signal φn and passing an appropriate logic circuit. The control signal 34 to the booster 41 is generated on the basis of these internal clock signals. The control signal 34 is defined, for example, as the logical sum (OR-gate logic) signal of the negative logical sum (NOR-gate logic) signal of the clock signals φn1 and φn2 and the logical product (AND-gate logic) signal of the clock signals φn2 and φn3. The control signal 34 enables the booster 41 to enter the boosting operation by the high level, and makes the booster 41 halt the boosting operation by the low level. Thereby, Te is defined as the high voltage application interval of the erase processing (erase voltage application interval), and Tw is defined as the high voltage application interval of the write processing (write voltage application interval). Thus, the erase voltage application interval Te is the sum of a boosting operation interval Tef from the boosting start by the booster 41 until first reaching the defined high voltage (−Vpp) and the clamping operation interval of the boosted voltage. The write voltage application interval Tw is the sum of a boosting operation interval Twf from the boosting start by the booster 41 until first reaching the defined high voltage (−Vpp) and the clamping operation interval of the boosted voltage. The clamping operation by the voltage clamping circuit 42 is to execute a feedback control of the operation of the booster 41 by inputting the boosted voltage, which is not especially restricted. The booster 41 employing the charge pumping and the voltage clamping circuit 42 that executes the feedback control of the boosted voltage are well known, and the details thereof will be omitted.

When the clock signal φf is selected in the fast mode, the foregoing signals φn1, φn2, φn3 are illustrated as the timing signals φf1, φf2, φf3, and the generation logics thereof and the generation logic of the control signal 34 to the booster 41 are all the same as the above. Therefore, to the degree that the frequency of the clock signal φf is higher, the cycle of the control signal 34 becomes shorter; accordingly, the erase voltage application interval Tes is made shorter than the time Te, and the write voltage application interval Tws is made shorter than the time Tw.

In the mode of use that finds precedence in fast rewrite to the nonvolatile memory, or the mode of use that finds precedence in frequent rewrite to the nonvolatile memory and data retention during the power supply being cut off, it is only needed to select the fast mode. In the mode of use that finds precedence in the data retention characteristic, it is only needed to select the normal mode. Thereby, the EEPROM 1 facilitates to meet both of the mode of use that puts fast rewrite to precedence, and the mode of use that puts the data retention characteristic to precedence.

Figure 9:
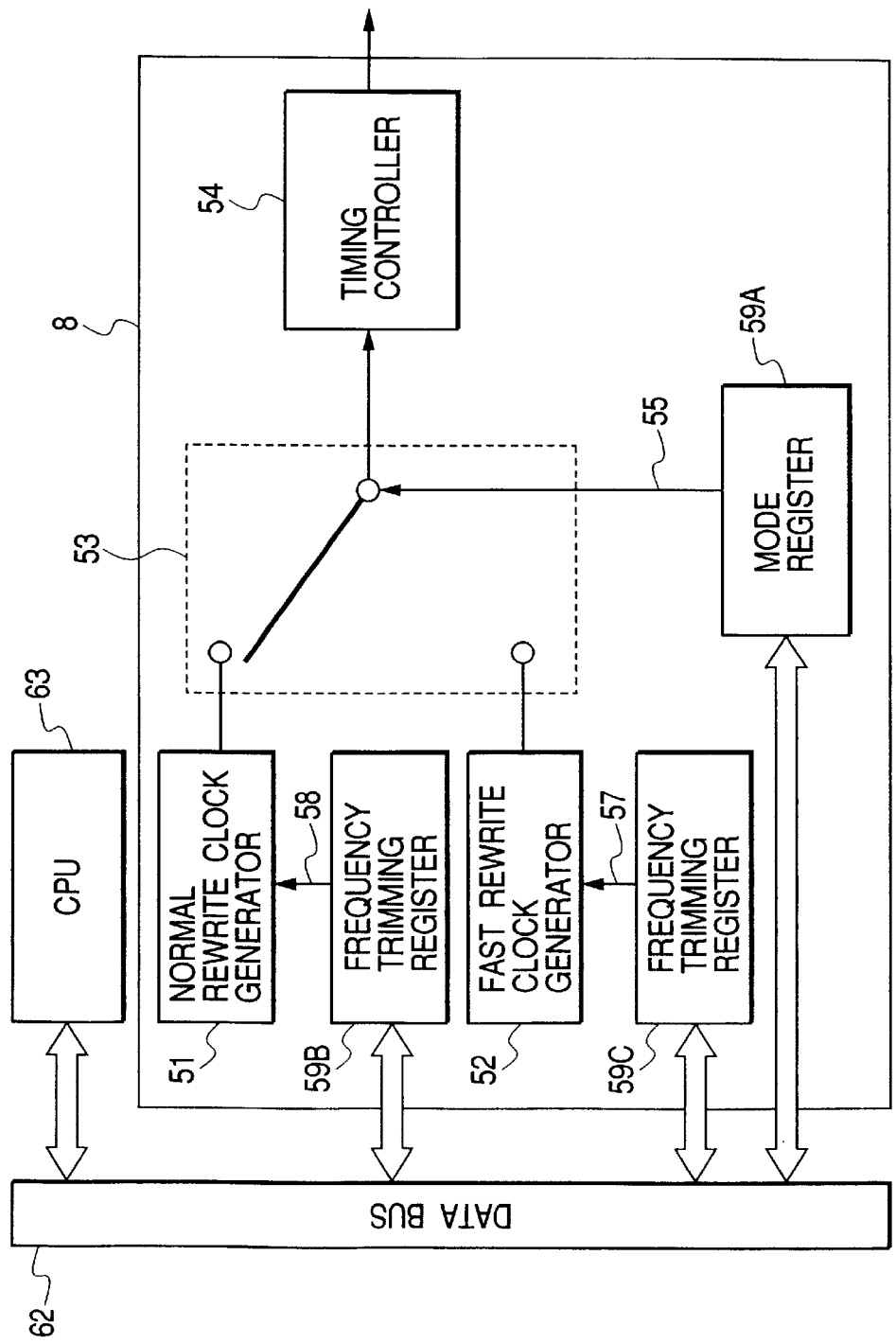
FIG. 9 is a block diagram illustrating the detail of a register included in the setting circuit.

FIG. 9 illustrates the detail of the register 59 included in the setting circuit 50. The register 59 is composed of a mode register 59A, frequency trimming register 59B to the normal rewrite clock generator 51, and frequency trimming register 59C to the fast rewrite clock generator 52. The mode register 59A retains the selection data of the selector 53, namely, the selection information of the normal mode and the fast mode. The frequency trimming register 59B retains the data for designating the gate stage number in the feedback loop of the ring oscillator included in the normal rewrite clock generator 51, that is, the frequency selection data of the clock signal φn. The frequency trimming register 59C retains the data for designating the gate stage number in the feedback loop of the ring oscillator included in the fast rewrite clock generator 52, that is, the frequency selection data of the clock signal φf. As shown in FIG. 9, a CPU 63 is made to execute the data settings to the registers 59A, 59B, and 59C through a data bus 62.

Figure 10:
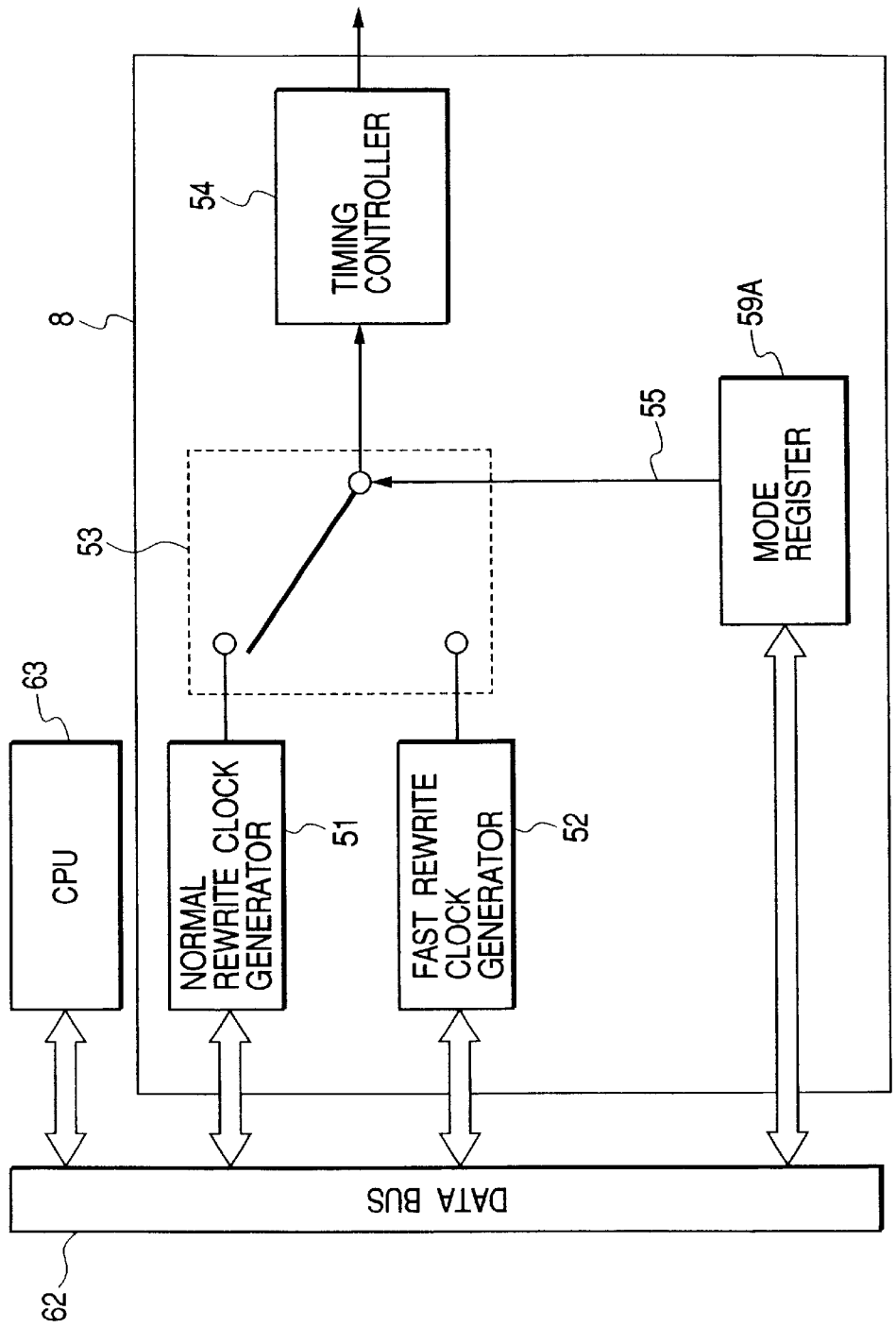
FIG. 10 is a block diagram illustrating a controller having a frequency trimming register omitted for simplification.

FIG. 10 illustrates another example of the controller 8. This example omits the frequency trimming registers 59B and 59C from FIG. 9 to simplify the construction.

Figure 11:
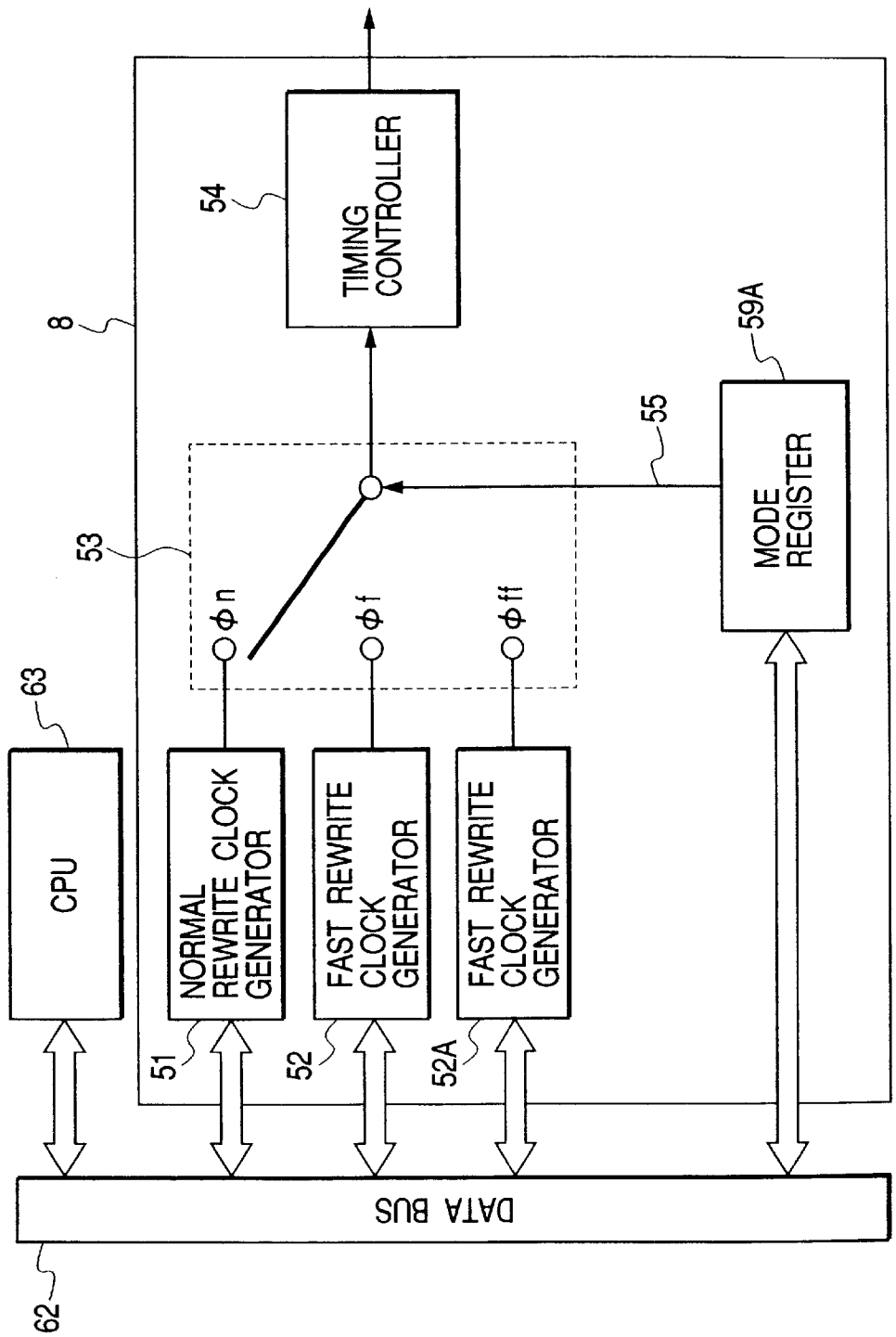
FIG. 11 is a block diagram illustrating a controller that includes a fast rewrite clock generator and another fast rewrite clock generator in addition.

FIG. 11 illustrates another example of the controller 8. This example adds another fast rewrite clock generator 52A to the fast rewrite clock generator 52, whereby the selector 53 is made selectable of the clock signal φff outputted from the fast rewrite clock generator 52A. The clock signal φff has a still higher frequency than the clock signal φf. As apparent from this example, the number of the clock generators may be more than four. Although not illustrated particularly, it is naturally allowed to provide the frequency trimming registers 59B and 59C.

Figure 12:
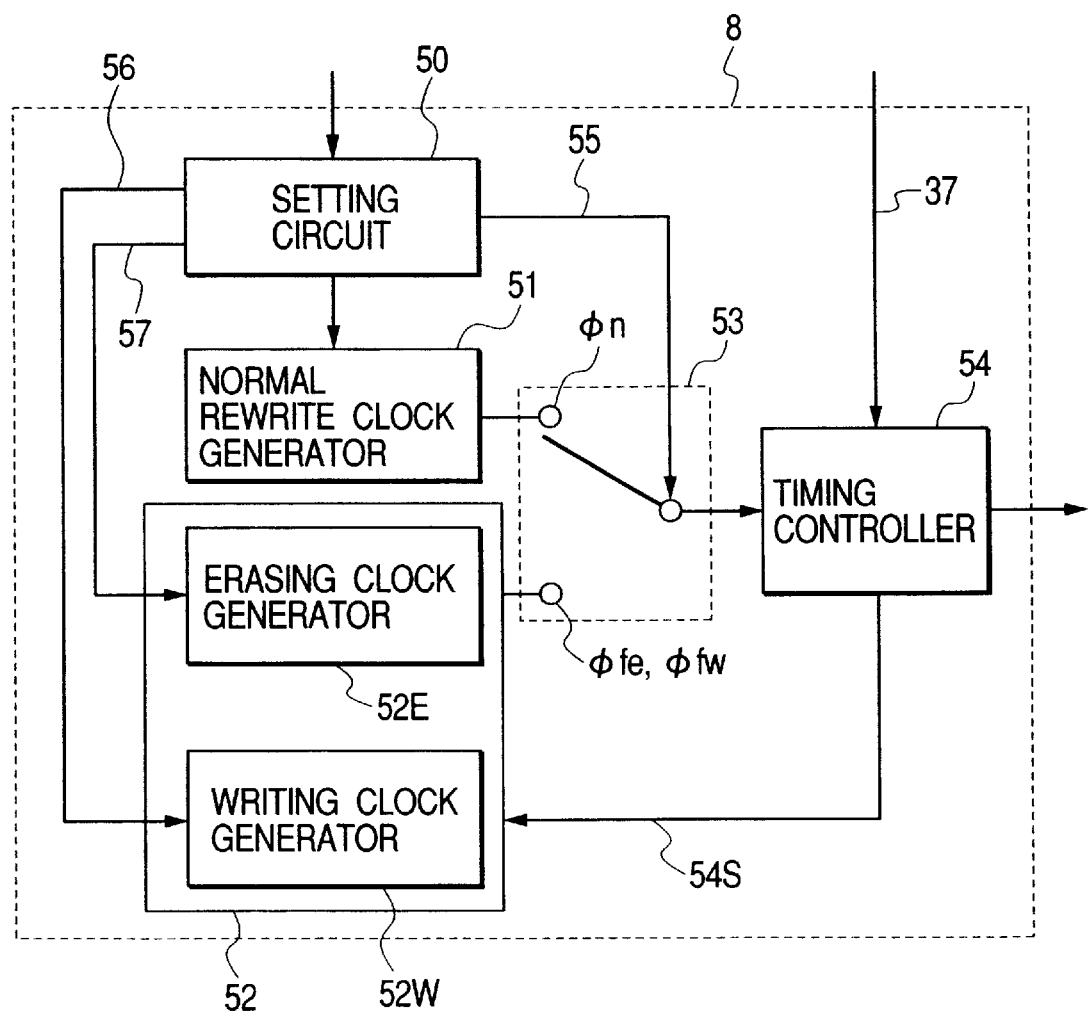
FIG. 12 is a block diagram illustrating a controller that includes an erase clock generator and write clock generator separately in the fast rewrite clock generator.

FIG. 12 illustrates another example of the controller 8. This example provides the fast rewrite clock generator 52 with an erase clock generator 52E and a write clock generator 52W individually; the erase clock generator 52E generates a clock signal φfe to be used in the erase operation, and the write clock generator 52W generates a clock signal φfw to be used in the write operation. For switching the clock signal φfe and clock signal φfw, it is needed to utilize the rising variation of the clock signal φf2 as already mentioned in FIG. 8, and to supply a new timing signal 54S that synchronizes with the clock signal φf2 to the fast rewrite clock generator 52 from the timing controller 54. In this case, the frequency trimming control information to each of the clock generators 52E and 52W may be individualized as illustrated in 57E and 57W. Although not illustrated, the frequency trimming control information to each of the clock generators 52E and 52W can be made common to both.

Figure 13:
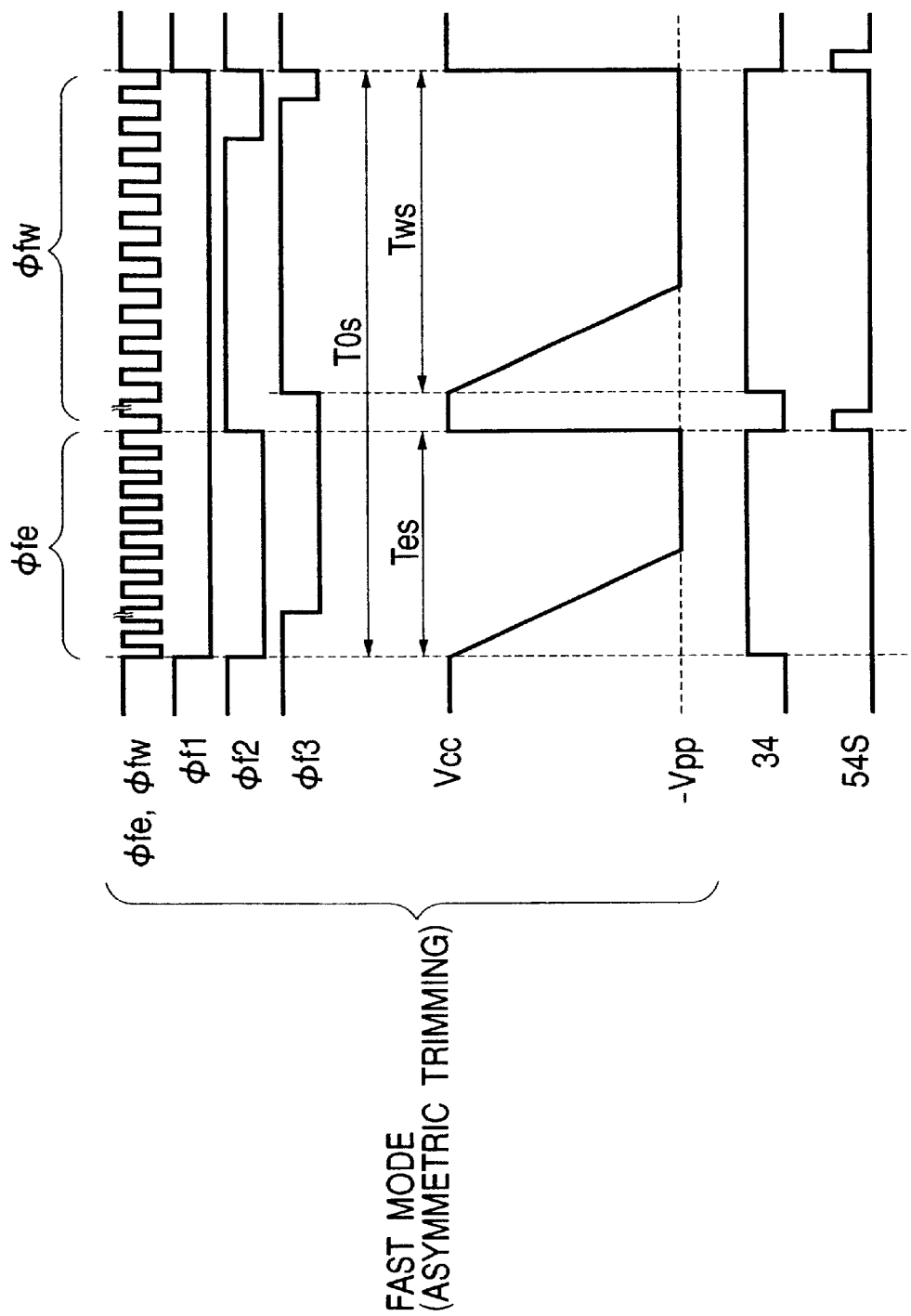
FIG. 13 is a waveform chart illustrating the timing of the rewrite operation (information storage operation) in the fast mode by the circuit in FIG. 12.

FIG. 13 illustrates the timing of the rewrite operation (information storage operation) in the fast mode by the circuit in FIG. 12. Timing signals φf1, φf2, φf3 in the fast mode are generated by frequency-dividing the clock signal φfe in the erase processing, and by frequency-dividing the clock signal φfw in the write processing. These clock signals are served as internal clock signals of the timing controller 54, which are generated by passing an appropriate logic circuit. The control signal 34 to the booster 41 is generated on the basis of these internal clock signals. The control signal 34 is defined, for example, as the logical sum (OR-gate logic) signal of the negative logical sum (NOR-gate logic) signal of the clock signals φf1 and φf2 and the logical product (AND-gate logic) signal of the clock signals φf2 and φf3. The control signal 34 enables the booster 41 to enter the boosting operation by the high level, and makes the booster 41 halt the boosting operation by the low level. Since the frequencies of the clock signals φfe and φfw can be set separately in the erase processing and write processing, the erase interval and write interval of the fast mode can be set separately.

Figure 14:
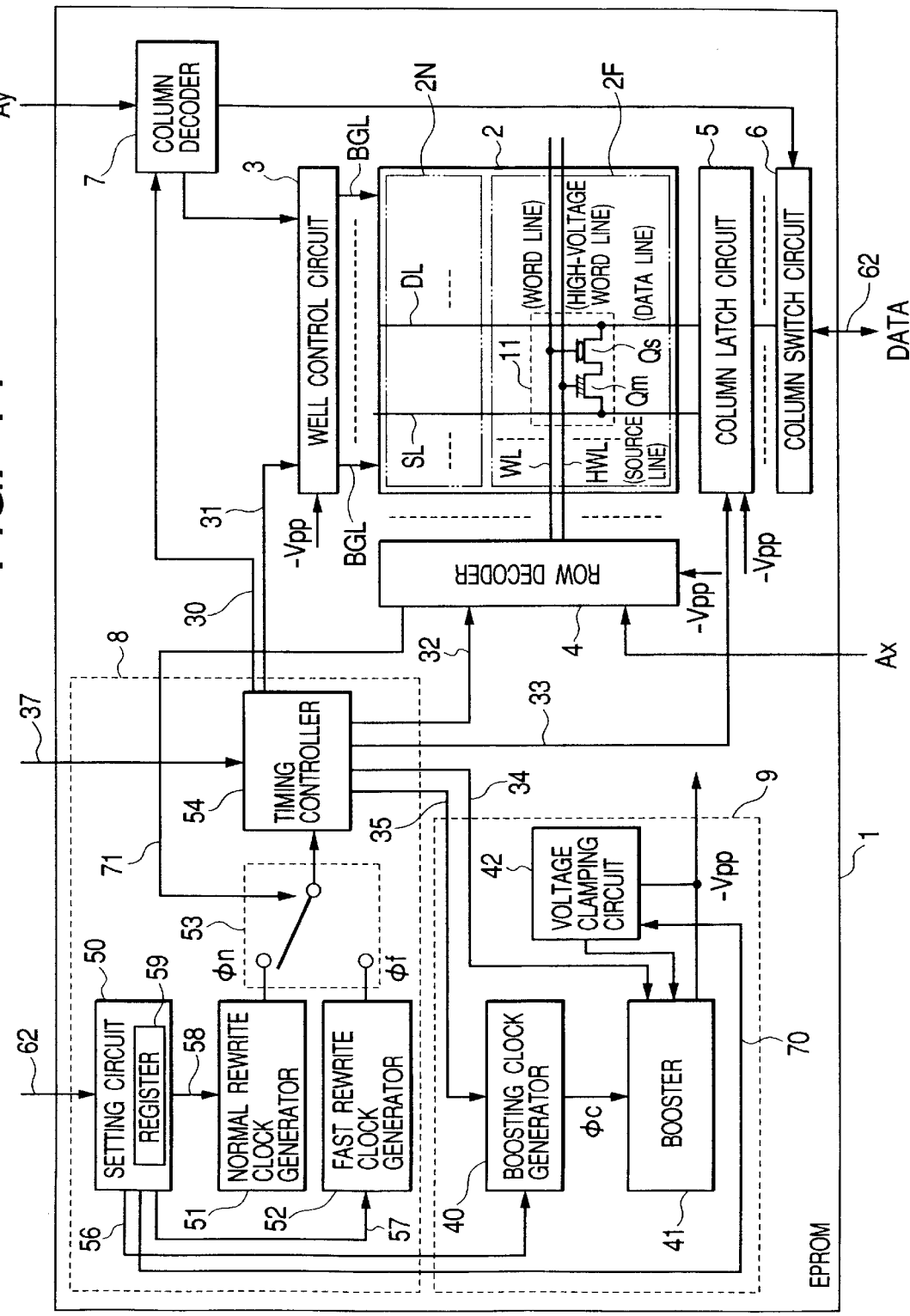
FIG. 14 is a block diagram illustrating an EEPROM that makes the clamping voltage level selectable in contrast to the EEPROM in FIG. 1, and executes a clock selection by a selector on the basis of an accessed address.

FIG. 14 illustrates another example of the EEPROM 1. This example makes the clamping voltage selectable in contrast to the EEPROM 1 in FIG. 1, and executes a clock selection by the selector 53 on the basis of an accessed address, which is different from the former.

In order to make the clamping voltage selectable, the register 59 of the setting circuit 50 is provided with a retention region for clamping voltage-setting data. The voltage clamping circuit 42 is supplied with a clamping voltage control signal 70 based on the clamping voltage-setting data. Although not illustrated, the voltage clamping circuit 42 is configured, as a circuit to define the clamping voltage, to divide by resistors the boosted voltage from the booster 41, to compare a divided voltage with a reference voltage, to halt the boosting operation when the comparison result exceeds the reference voltage, and to resume the operation when it is lower than the reference voltage.

Here, the clamping voltage control signal 70 is made to function as a selection signal for the reference voltage; when the absolute value of the boosted voltage is to be increased, the reference voltage is increased, and when the absolute value is to be decreased, the reference voltage is decreased. To expand the width of selection, it is needed to increase the bit number of the clamping voltage control signal 70. When the clamping voltage is increased, it is possible to attain the data retention characteristic equivalent to that degree, even if the erase and write processing time is shortened. However, when the clamping voltage has to be varied to the extent that such a difference becomes apparent, it becomes necessary to provide the circuit devices with the withstanding voltage required for that. Here, it is sufficient to make the clamping voltage selectable only in the fast mode.

In order to perform the clock selection on the basis of accessed addresses, the EEPROM has a normal region 2N and fast region 2F set in the memory array 2, and loads the row decoder 4 with the decode logic that discriminates the difference thereof. When accessing the normal region 2N, the row decoder 4 makes the selector 53 select the clock signal φn outputted from the normal rewrite clock generator 51 by means of the control signal 71. When accessing the fast region 2F, the row decoder 4 makes the selector 53 select the clock signal φf outputted from the fast rewrite clock generator 52 by means of the control signal 71. Thereby, it becomes possible to execute the fast rewrite to a specified fast region 2F of the memory array 2.

Figure 15:
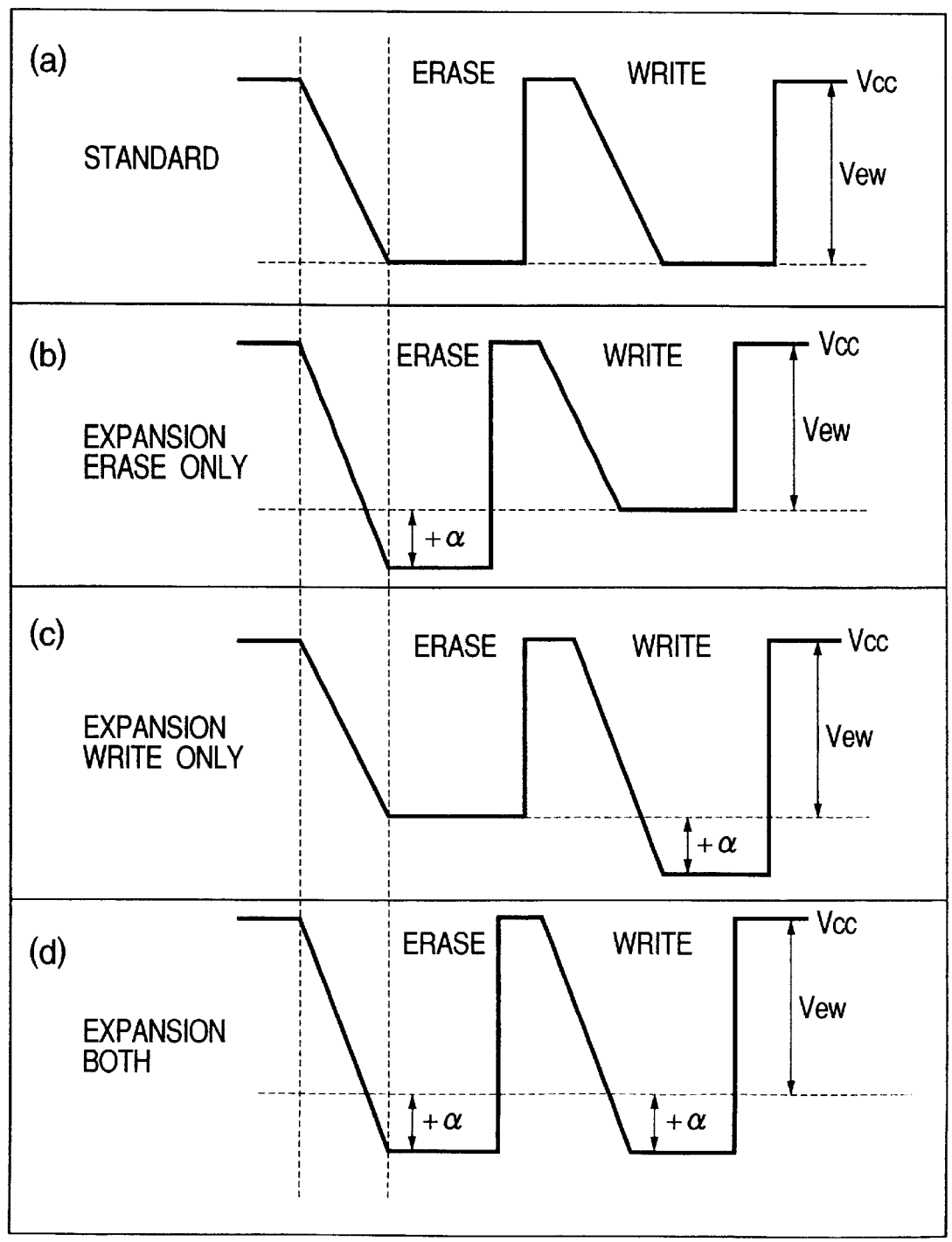
FIG. 15 is a waveform chart illustrating various high voltage waveforms used for the erase and write processing when the clamping voltage level is made selectable.

FIG. 15 illustrates various high voltage waveforms used for the erase and write processing when the clamping voltage is made selectable. In the drawing, Vew signifies the standard boosting width of the voltage (−Vpp) to the supply voltage Vcc. To take on the construction illustrated in FIG. 14 will make it possible to expand the boosted voltage by +α to the standard of FIG. 15(a) for both the erase and write processing, as shown in FIG. 15(d). In case of expanding the boosting level only in the write processing or erase processing, as shown in FIGS. 15(b), 15(c), it is needed to store the clamping voltage setting data into the register 59 separately for the write processing and erase processing, to generate the control signals 70 for the write processing and erase processing on the basis of each of the clamping voltage setting data, and to select and supply either of them to the voltage clamping circuit 42. To select it needs to use the control signal 54S, as mentioned in FIG. 12. Thereby, it becomes possible to separately control each of the clamping levels for the erase and write processing.

Figure 16:
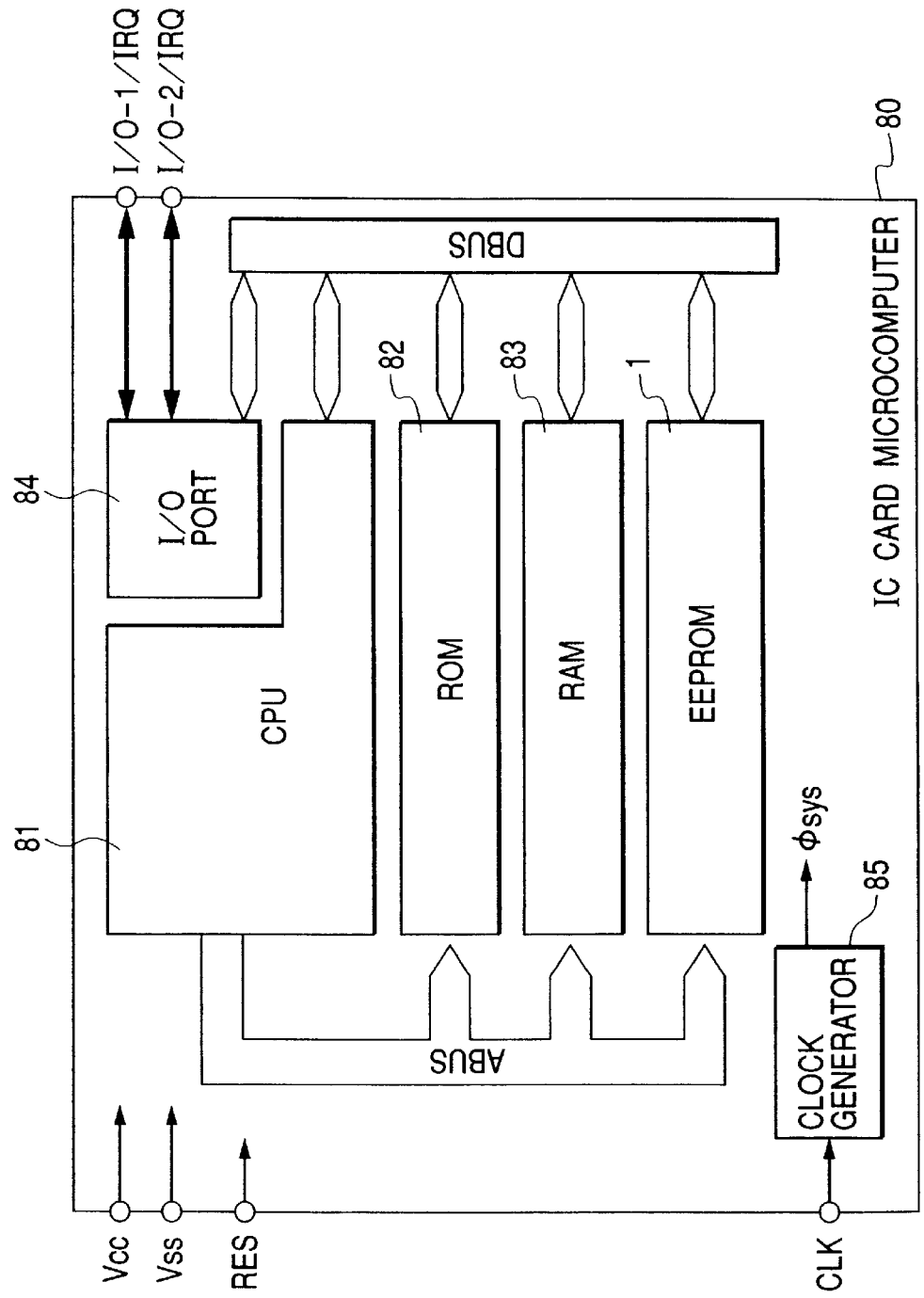
FIG. 16 is a block diagram illustrating a system configuration that applies the EEPROM to a microcomputer for an IC card.

FIG. 16 illustrates a system configuration that applies the EEPROM 1 to a microcomputer for an IC card (IC card microcomputer) 80. The IC card microcomputer 80 includes the EEPROM 1, a CPU 81, ROM 82, RAM 83, I/O port 84 as the input/output circuit, and clock generator 85, which is formed on one semiconductor substrate made of a single crystal silicon or the like. In the drawing, ABUS signifies the address bus, and DBUS the data bus. The IC card microcomputer 80 also possesses a power supply terminal Vcc, ground terminal Vss, clock terminal CLK, reset terminal RES, and input/output terminals I/O-1, I/O-2 as the external terminal, which is not particularly restricted.

The CPU 81 fetches instructions and executes the instructions fetched. The ROM 82 or the EEPROM 1 stores the instructions that the CPU 81 fetched, and also takes in from the outside through the I/O port 84. The RAM 83 is served as a work area or a temporary data storage area in the CPU 81. The I/O port 84 sends/receives data and commands, etc., to/from the outside of the IC card microcomputer 80. The clock generator 85 generates an operation reference clock signal φsys for the internal circuits such as the CPU 81 and EEPROM 1. With regard to the EEPROM 1, the operation reference clock signal φsys is used as the reference clock signal for oscillators in the normal rewrite clock generator 51, fast rewrite clock generator 52, and boosting clock generator 40, etc.

Figure 17:
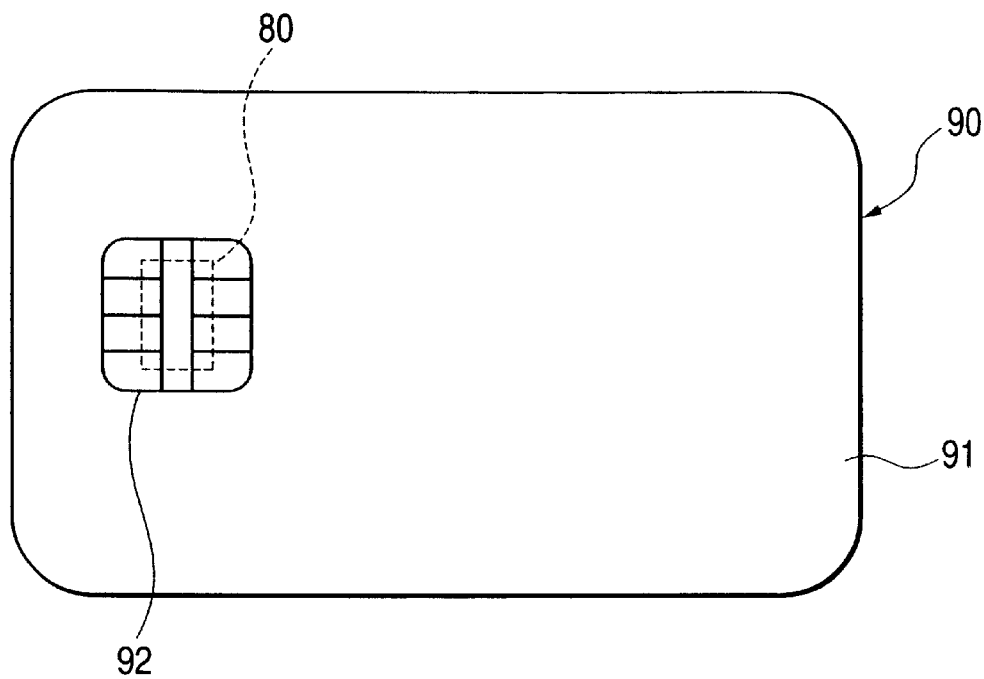
FIG. 17 is a plan view illustrating an external appearance of the IC card incorporating the microcomputer for the IC card.

FIG. 17 illustrates an external appearance of an IC card 90 incorporating the IC card microcomputer 80 on a plan. The IC card microcomputer 80 is mounted on a wiring board 91 and sealed with a resin or the like, with an external connection terminal 92 exposed on the wiring board 91. The external terminal of the IC card microcomputer 80, such as the input/output terminals I/O-1, I/O-2 and so forth, is connected to the external connection terminal 92 on the wiring board 91.

Figure 18:
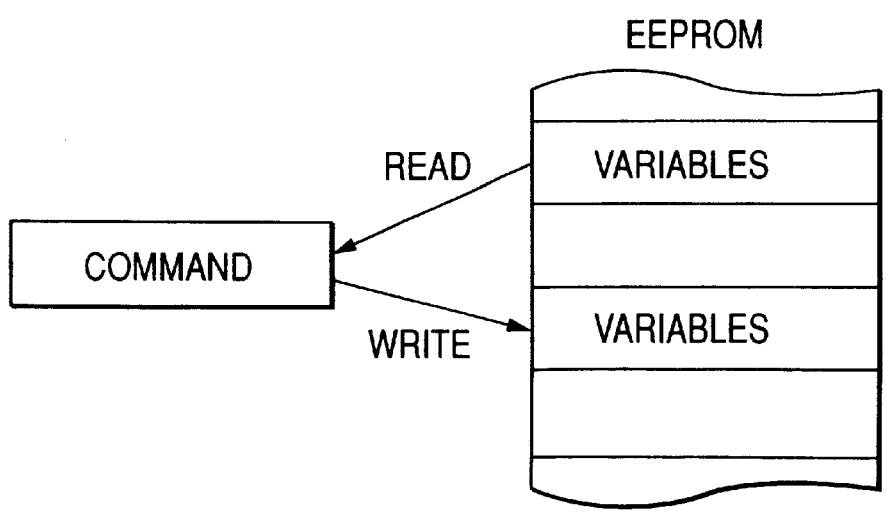
FIG. 18 is an explanatory chart typically illustrating the processing state in which multiple variables are frequently rewritten in the microcomputer for the IC card.
Figure 19:
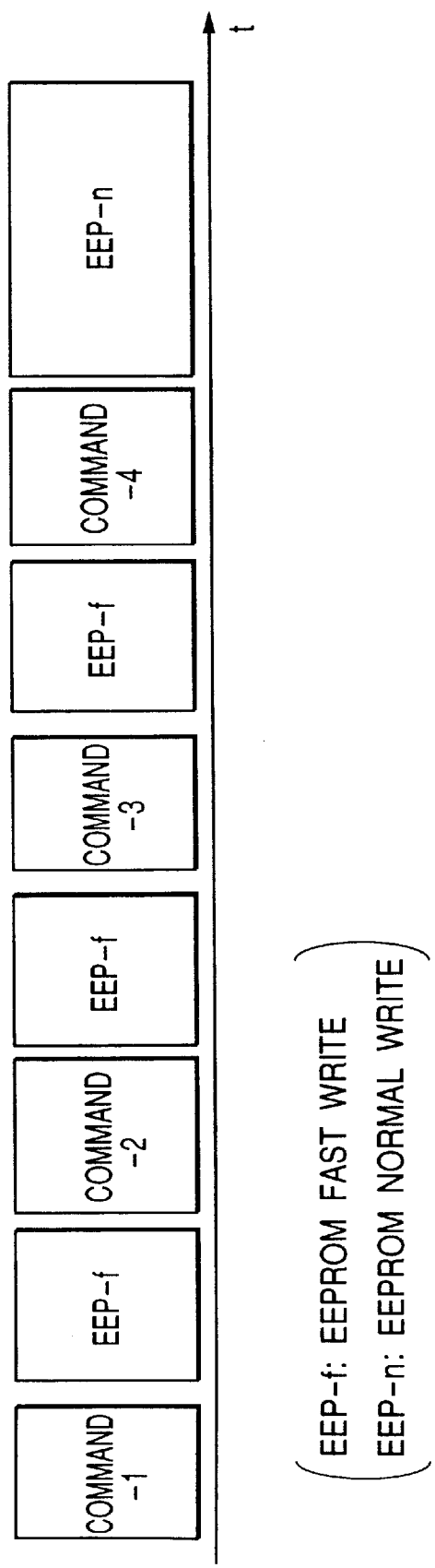
FIG. 19 is an explanatory chart illustrating the processing requiring a fast rewrite and the processing not requiring such a fast rewrite in a series manner on the time axis.

The IC card 90 is applied to ID cards, credit cards, bank deposit cards, and so forth, which are required for storing security information such as cash information and private information and so forth, and retaining the information in a nonvolatile manner. And, there is supposedly a case that utilizes an application program (virtual machine program) described in the programming language such as the JAVA (registered trademark) or the like in the IC card microcomputer 80. As illustrated in FIG. 18, it is necessary to frequently rewrite multiple variables in the execution of the virtual machine program, where the IC card is difficult to incorporate a large capacity of the RAM 83. And, since it handles the security information, if the temporary data are lost due to disconnection of the power supply and the like, it has to request the host to retransfer the information, which supposedly leads to a problem on the security. In view of these circumstances, the on-chip EEPROM 1 has few transistors that constitute the memory cells in comparison to an SRAM, and retains data in case of a momentary disconnection of the power supply, although it depends on the condition thereat, which is a notable feature intrinsic to the EEPROM. Besides, the EEPROM 1 possesses the operation mode such as the above fast mode that speeds up the erase and the write processing in comparison to the normal mode. In the execution of the virtual machine program, the IC card 90 uses the EEPROM 1 instead of the RAM 83 for writing and reading the variables. The data rewrite to the EEPROM 1 should be executed in the fast rewrite mode. When the rewrite time has been specified as 4 milliseconds in order to set ten years as the term of guarantee of the data retention characteristic in the normal mode, if the rewrite time is shortened to a half or a quarter, it will be possible to ensure a reasonable term of guarantee of the data retention characteristic, and moreover to realize the speed-up of the rewrite processing that frequently uses the EEPROM 1 as temporary areas. In the rewrite processing that does not require a high-speed, to select the normal mode will ensure a satisfactory data retention characteristic. FIG. 19 illustrates, in a series manner on the time axis, the processing of the virtual machine program (instruction-1 through instruction-3) that requires a fast rewrite of variables, and the processing of instruction-4 that does not require such a fast rewrite. The rewrite processing of the EEPROM 1 by the instruction-1 through instruction-3 is executed in the fast mode (EEP-f), and the rewrite processing of the EEPROM 1 by the instruction-4 is executed in the normal mode (EEP-n).

The switching of the operation mode relating to the erase and write processing of the EEPROM 1 can be performed by the CPU 81 mounted on the IC card 90 setting the values of the register 59. This processing can be realized, for example, by the CPU 81 executing the virtual machine program according to the descriptions of the program. Such a virtual machine program is stored in the EEPROM 1, or the ROM 82. Such a switching of the operation mode may be performed in accordance with the commands or control data that are given to the IC card 90 from the host through the I/O port 84. The processing of the CPU 81 may be designed to intervene in this processing, and the host may be configured to directly operate the register 59.

Figure 20:
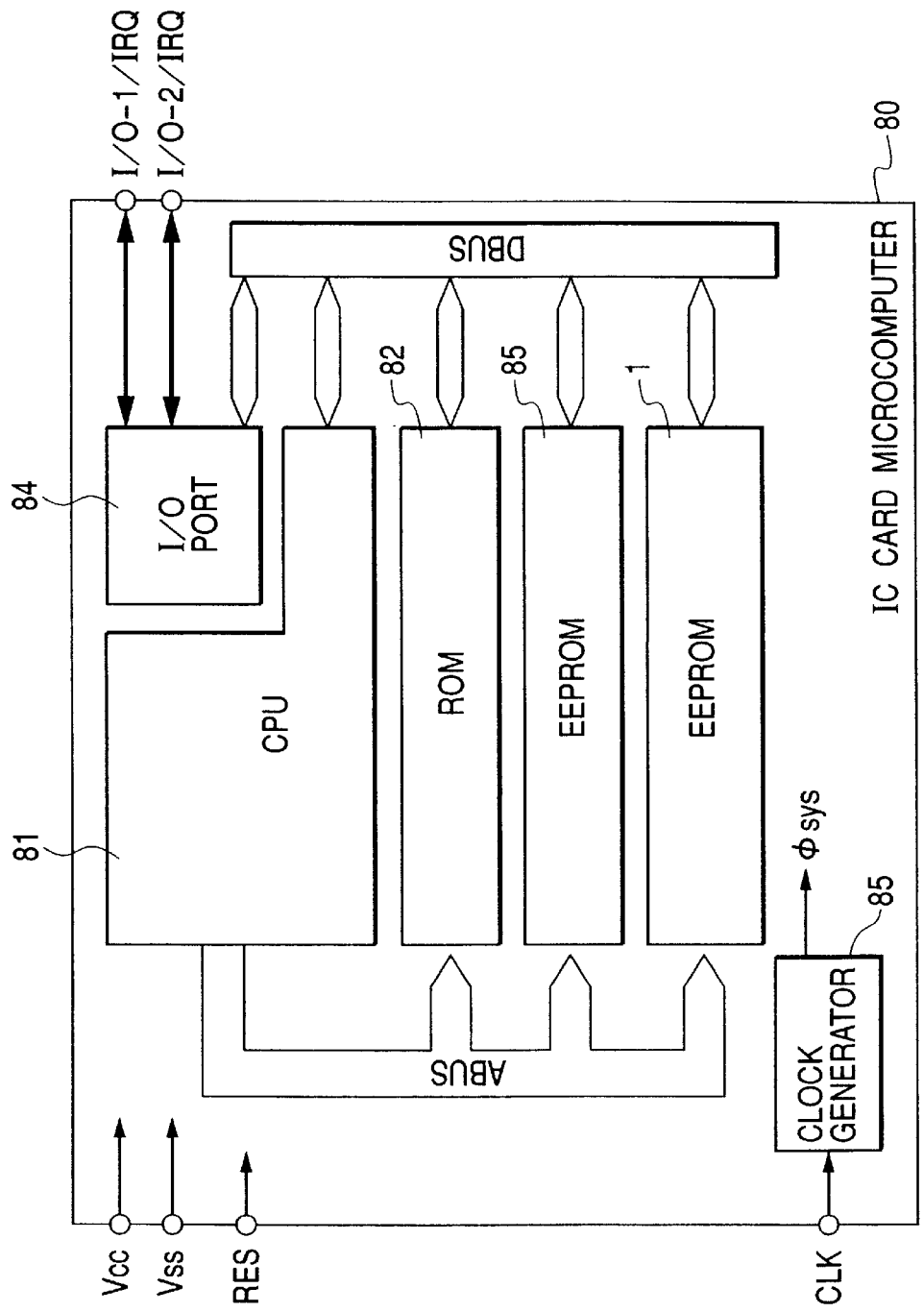
FIG. 20 is a block diagram illustrating another system configuration that applies the EEPROM to the microcomputer for the IC card.

In such an IC card 90 that mainly executes an application program such as the virtual machine program, it is preferable to provide an EEPROM 85 separately from the EEPROM 1, as shown in FIG. 20, which is intended to perform a fast rewrite of data instead of the RAM 83 in FIG. 16. In this case, the data storage to the EEPROM 85 is made always in the fast rewrite mode, and the data storage to the EEPROM 1 is made selectable of the fast rewrite mode or the normal rewrite mode. Thereby, it becomes possible to ensure the storage of data that needs secure data retention, even in such circumstances that electric stresses are accumulated to the memory cells by the repeated storages of data into the temporary areas. In this case, the EEPROM 1 and the EEPROM 85 may be configured in different memory bodies, or they may be configured in one memory body that is used dividedly by addresses.

The invention has been described concretely based on the embodiments, however the invention is not restricted to the above embodiments, and it should be well understood that various changes and modifications are possible without a departure from the sprit of the invention.

For example, the structure of the nonvolatile memory cell is not limited to the aforementioned structure, and it may take on a memory structure such that the source of the memory MOS transistor and the drain of the selection MOS transistor are removed, or a structure that employs a floating gate as a conductor in replacement of the silicon nitride film, or the like. Further, the method of applying the high voltage in the erase and write processing is not limited to the aforementioned descriptions, and it is possible to adopt the source side injection method using hot electrons. The interval of either one of the erase processing and write processing may be made variable. The control of the boosting speed into a constant can be made not only in the erase processing, but also in the write processing only or both of them. The time of the erase processing and write processing or the high voltage application interval is defined as the interval from the start of the boosting operation until the halt of the boosting operation after clamping in the aforementioned description based on FIG. 8, however the clamping operation interval may be defined as the interval from the time of first reaching a specified boosted voltage until the halt of the boosting operation, and the interval of the erase processing and write processing may be controlled based on the above clamping operation interval. Further, in regard to the data to be stored in the memory cells, it is not necessarily limited to one-bit information (binary data) per one memory cell, and one memory cell may be made to store more than two-bit information (multi-valued data). Incidentally, it becomes possible to store more than two-bit information by storing electrons each in a plurality of local regions on the silicon nitride film, in case the memory cell is of a type having the silicon nitride film, or by forming a plurality of threshold voltage distributions according to the quantity of electrons to be stored in the floating gate, in case the memory cell is of a type having the floating gate. Since it requires a longer write time for storing more than two-bit information in one memory cell, the temporary data to be written in the fast rewrite mode are written as the binary data, and the data that needs secure data retention are written as the multi-valued data; thereby, the storage of a large-capacity data can be achieved. It is also natural that the data processing device represented by the IC card microcomputer is able to execute an application program developed in the programming language except for the JAVA (registered trademark).

The invention can be applied widely to microcomputers except for the IC card microcomputer, various logic LSIs such as data processors, and the other data processing devices and so forth. Naturally, the invention can also be applied to a unit EEPROM chip, and also to a semiconductor memory by the other storage mode.

The invention disclosed here exhibits various effects, and typical ones thereof will be briefed as follows.

That is, thanks to the selection control that selects the application interval of the boosted voltage applied during the information storage operation and so forth, it becomes easy to meet both of the mode of use that finds precedence in fast rewrite to the nonvolatile memory, and the mode of use that finds precedence in the data retention characteristic. From the other point of view, it becomes easy to meet both of the mode of use that finds precedence in frequent rewrite to the nonvolatile memory and data retention during the power supply being cut off, and the mode of use that finds precedence in the data retention characteristic.

The difference of the boosting speed of the voltages applied to the nonvolatile memory cells in the erase and write processing leads to the difference of the electric stresses given to the memory cells in applying the high voltage. Since the electric stresses affect the rewritable frequency of the nonvolatile memory cells, the difference thereof creates the dispersion of secular characteristic deterioration. The creation of such dispersion can be suppressed by controlling the boosting speed of the voltages applied to the nonvolatile memory cells in the erase and write processing to be constant according to the magnitude of the load of the booster.

What is claimed is:

1. A data processing device comprising a central processing unit and a nonvolatile memory, wherein the central processing unit executes an information storage control to the nonvolatile memory, wherein the information storage control is to execute erase and write of data stored in the nonvolatile memory, wherein in a first information storage control of the information storage control, an information storage control is executed which requires a first time for the erase of the data stored in the nonvolatile memory, wherein in a second information storage control of the information storage control, an information storage control is executed which requires a second time shorter than the first time for the erase of the data stored in the nonvolatile memory, and wherein either of the first information storage control and the second information storage control is made selectable.

2. A data processing device according to claim 1, wherein in the first information storage control, the write of the data to be stored in the nonvolatile memory requires a third time, and wherein in the second information storage control, the write of the data to be stored in the nonvolatile memory requires a fourth time shorter than the third time.

3. A data processing device according to claim 2, comprising a memory area that stores a program executed by the central processing unit, wherein the program controls a step, in storing data in the nonvolatile memory, that selects either to store the data by the first information storage control, or to store the data by the second information storage control.

4. A data processing device according to claim 3, comprising a register that designates to select either of the first information storage control and the second information storage control, wherein the step sets information for indicating the register to select either of the first information storage control and the second information storage control.

5. A data processing device according to claim 4, wherein the register contains an area that allows setting at least one of the second time and the fourth time.

6. A data processing device according to claim 3, wherein the memory area is a part of the nonvolatile memory.

7. A data processing device according to claim 2, wherein the central processing unit receives control information for selecting either to execute the first information storage control, or to execute the second information storage control, from the outside of the data processing device.

* * * * *